US010403676B2

(12) United States Patent
Hosokawa et al.

(10) Patent No.: US 10,403,676 B2
(45) Date of Patent: Sep. 3, 2019

(54) SEMICONDUCTOR DEVICE MANUFACTURING METHOD

(71) Applicant: HAMAMATSU PHOTONICS K.K., Hamamatsu-shi, Shizuoka (JP)

(72) Inventors: Noburo Hosokawa, Hamamatsu (JP); Nao Inoue, Hamamatsu (JP); Katsumi Shibayama, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 15/562,001

(22) PCT Filed: Mar. 31, 2016

(86) PCT No.: PCT/JP2016/060832
§ 371 (c)(1),
(2) Date: Sep. 27, 2017

(87) PCT Pub. No.: WO2016/159318
PCT Pub. Date: Oct. 6, 2016

(65) Prior Publication Data
US 2018/0175100 A1    Jun. 21, 2018

(30) Foreign Application Priority Data

Mar. 31, 2015   (JP) ................ 2015-070697

(51) Int. Cl.
*H01L 27/146*    (2006.01)
*H01L 23/00*    (2006.01)
(Continued)

(52) U.S. Cl.
CPC .... *H01L 27/14687* (2013.01); *H01L 21/3205* (2013.01); *H01L 21/768* (2013.01);
(Continued)

(58) Field of Classification Search
None
See application file for complete search history.

(56) References Cited

U.S. PATENT DOCUMENTS 9,601,426 B1    3/2017   Bonilla et al.
9,659,980 B2    5/2017   McGarvey et al.
(Continued)

FOREIGN PATENT DOCUMENTS

EP        1519410      3/2005
EP        2802005      11/2014
(Continued)

OTHER PUBLICATIONS

International Preliminary Report on Patentability dated Oct. 12, 2017 for PCT/JP2016/060832.
(Continued)

*Primary Examiner* — Alexander G Ghyka
(74) *Attorney, Agent, or Firm* — Drinker Biddle & Reath LLP

(57) ABSTRACT

A method includes a first process in which a first wiring is provided on a surface of a semiconductor substrate; a second process in which a light transmitting substrate is attached to the surface; a third process in which the semiconductor substrate is thinned so that the thickness of the semiconductor substrate is smaller than the thickness of the light transmitting substrate; a fourth process in which a through hole is formed in the semiconductor substrate; a fifth process in which a dip coating method is performed using a resin material and thus a resin insulating layer is provided; a sixth process in which a contact hole is formed in the resin insulating layer; and a seventh process in which a second wiring is provided on a surface of the resin insulating layer, and the first wiring and the second wiring are electrically connected via a contact hole.

9 Claims, 14 Drawing Sheets

(51) Int. Cl.
*H01L 21/3205* (2006.01)
*H01L 23/522* (2006.01)
*H01L 23/532* (2006.01)
*H01L 21/768* (2006.01)
*H01L 31/107* (2006.01)
*H01L 31/02* (2006.01)
*H01L 31/0216* (2014.01)
*H01L 31/103* (2006.01)
*H01L 23/48* (2006.01)
*H01L 31/0224* (2006.01)
*H01L 31/0203* (2014.01)

(52) U.S. Cl.
CPC ...... *H01L 21/76898* (2013.01); *H01L 23/481* (2013.01); *H01L 23/522* (2013.01); *H01L 23/532* (2013.01); *H01L 24/02* (2013.01); *H01L 24/05* (2013.01); *H01L 27/14632* (2013.01); *H01L 27/14636* (2013.01); *H01L 27/14643* (2013.01); *H01L 31/02005* (2013.01); *H01L 31/02161* (2013.01); *H01L 31/022408* (2013.01); *H01L 31/103* (2013.01); *H01L 31/107* (2013.01); *H01L 24/13* (2013.01); *H01L 31/0203* (2013.01); *H01L 2224/0233* (2013.01); *H01L 2224/0235* (2013.01); *H01L 2224/0236* (2013.01); *H01L 2224/02313* (2013.01); *H01L 2224/02371* (2013.01); *H01L 2224/02372* (2013.01); *H01L 2224/02381* (2013.01); *H01L 2224/0345* (2013.01); *H01L 2224/0557* (2013.01); *H01L 2224/05558* (2013.01); *H01L 2224/05567* (2013.01); *H01L 2224/10126* (2013.01); *H01L 2224/11* (2013.01); *H01L 2224/12105* (2013.01); *H01L 2224/13007* (2013.01); *H01L 2224/13009* (2013.01); *H01L 2224/13021* (2013.01); *H01L 2224/13022* (2013.01); *H01L 2224/13024* (2013.01); *H01L 2224/13025* (2013.01); *H01L 2924/10253* (2013.01); *H01L 2924/12043* (2013.01); *H01L 2924/351* (2013.01)

(56) References Cited

U.S. PATENT DOCUMENTS

| | | | |
|---|---|---|---|
| 9,691,932 | B2 | 6/2017 | Sasaki et al. |
| 2009/0008566 | A1 | 1/2009 | Agarwal et al. |
| 2012/0068327 | A1 | 3/2012 | Oganesian et al. |
| 2012/0068330 | A1 | 3/2012 | Oganesian et al. |
| 2012/0205816 | A1 | 8/2012 | Son et al. |
| 2014/0131882 | A1 | 5/2014 | Law et al. |
| 2015/0096798 | A1 | 4/2015 | Uzoh |
| 2017/0236852 | A1 | 8/2017 | McGarvey et al. |

FOREIGN PATENT DOCUMENTS

| | | |
|---|---|---|
| JP | S59-126643 A | 7/1984 |
| JP | H2-268416 | 11/1990 |
| JP | H4-014830 | 1/1992 |
| JP | H7-321205 | 12/1995 |
| JP | H08-330295 A | 12/1996 |
| JP | 2003-101222 A | 4/2003 |
| JP | 2004-057507 A | 2/2004 |
| JP | 2005-019521 | 1/2005 |
| JP | 2005-101268 | 4/2005 |
| JP | 2006-215062 A | 8/2006 |
| JP | 2007-105859 A | 4/2007 |
| JP | 2007-305955 A | 11/2007 |
| JP | 2008-277371 A | 11/2008 |
| JP | 2013-89918 A | 5/2013 |
| JP | 2013-089919 A | 5/2013 |

OTHER PUBLICATIONS

International Preliminary Report on Patentability dated Oct. 12, 2017 for PCT/JP2016/060837.

International Preliminary Report on Patentability dated Oct. 12, 2017 for PCT/JP2016/060834.

International Preliminary Report on Patentability dated Oct. 12, 2017 for PCT/JP2016/060838.

(a)

(b)

(a)

(b)

(a)

(b)

(a)

(b)

(a)

(b)

SEMICONDUCTOR DEVICE MANUFACTURING METHOD

TECHNICAL FIELD

The present invention relates to a method of manufacturing a semiconductor device.

BACKGROUND ART

In semiconductor devices such as an optical device and an electronic device, a front surface side and a rear surface side of the semiconductor substrate are electrically connected to each other via a through hole formed in the semiconductor substrate (for example, refer to Patent Literature 1).

CITATION LIST

Patent Literature

Patent Literature 1: Japanese Unexamined Patent Publication No. 2004-57507

SUMMARY OF INVENTION

Technical Problem

In the semiconductor device described above, the semiconductor substrate tends to become thinner according to reduction in size thereof, high integration, and the like. As a result, when the semiconductor device is manufactured, damage is likely to occur in a peripheral portion of the through hole, and it is difficult to ensure electrical insulation between a wiring in the through hole and the semiconductor substrate.

Here, an object of the present invention is to provide a method of manufacturing a semiconductor device through which it is possible to prevent damage to a peripheral portion of a through hole while thinning a semiconductor substrate, and it is possible to ensure electrical insulation between a wiring in the through hole and the semiconductor substrate.

Solution to Problem

According to one aspect of the present invention, there is provided a method of manufacturing a semiconductor device, including a first process in which a first wiring is provided on a first surface of a semiconductor substrate including the first surface and a second surface opposite to each other; a second process in which a support substrate is attached to the first surface after the first process; a third process in which a portion of the semiconductor substrate on the second surface side is removed and thus the semiconductor substrate is thinned so that the thickness of the semiconductor substrate is smaller than the thickness of the support substrate after the second process; a fourth process in which a through hole to extend from the first surface to the second surface is formed in the semiconductor substrate, and a part of the first wiring is exposed to a first opening of the through hole on the first surface side after the third process; a fifth process in which a dip coating method is performed using a first resin material and thus a resin insulating layer that is continuous through a second opening of the through hole on the second surface side is provided on an inner surface of the through hole and the second surface after the fourth process; a sixth process in which a contact hole is formed in the resin insulating layer, and the part of the first wiring is exposed to an opening of the contact hole on the first surface side after the fifth process; and a seventh process in which a second wiring is provided on a surface of the resin insulating layer, and the first wiring and the second wiring are electrically connected in the opening of the contact hole on the first surface side after the sixth process.

In the method of manufacturing a semiconductor device, processes after the process of thinning the semiconductor substrate are performed while the support substrate is attached to the semiconductor substrate. Accordingly, it is possible to prevent damage to a peripheral portion of the through hole. In addition, when the dip coating method is performed, the resin insulating layer is formed. Accordingly, it is possible to reliably form the resin insulating layer having a sufficient thickness at which electrical insulation can be ensured. Therefore, according to the method of manufacturing a semiconductor device, it is possible to prevent damage to the peripheral portion of the through hole while thinning the semiconductor substrate, and it is possible to ensure electrical insulation between a wiring in the through hole and the semiconductor substrate.

In the method of manufacturing a semiconductor device according to one aspect of the present invention, in the fifth process, the semiconductor substrate to which the support substrate is attached may be immersed in the stored first resin material so that a liquid level of the stored first resin material intersects the first surface, and the semiconductor substrate to which the support substrate is attached may be pulled out of the stored first resin material so that the liquid level of the stored first resin material intersects the first surface. Accordingly, for example, compared to when immersion in and pulling out of the first resin material are performed while the liquid level of the stored first resin material and the first surface of the semiconductor substrate are parallel to each other, it is possible to reduce stress generated in the peripheral portion of the through hole. In addition, for example, compared to when immersion in and pulling out of the first resin material are performed while the liquid level of the stored first resin material and the first surface of the semiconductor substrate are parallel to each other, it is possible to prevent bubbles from remaining on the resin insulating layer formed on the inner surface of the through hole.

In the method of manufacturing a semiconductor device according to one aspect of the present invention, in the fifth process, the dip coating method may be performed using the first resin material having a viscosity of 10 cp or more. Accordingly, it is possible to form the resin insulating layer having a sufficient thickness at which electrical insulation can be ensured more reliably.

In the method of manufacturing a semiconductor device according to one aspect of the present invention, in the sixth process, the first resin material adhered to a surface of the support substrate on the side opposite the semiconductor substrate in the fifth process may be removed. Accordingly, for example, when the semiconductor device is an optical device, even if a light transmitting substrate is used as the support substrate, since the first resin material is removed from the support substrate, the support substrate can effectively function as the light transmitting substrate.

The method of manufacturing a semiconductor device according to one aspect of the present invention may further include an eighth process in which a dip coating method is performed using a second resin material and thus a resin protective layer is provided on a surface of the resin insulating layer to cover the second wiring after the seventh process, and a ninth process in which an opening is formed in the resin protective layer and a part of the second wiring is exposed to the opening after the eighth process. Accordingly, it is possible to reliably form the resin protective layer having a sufficient thickness at which the second wiring can be protected. In addition, a part of the second wiring can be used as a pad portion for electrical connection with the outside.

In the method of manufacturing a semiconductor device according to one aspect of the present invention, in the eighth process, the semiconductor substrate to which the support substrate is attached may be immersed in the stored second resin material so that a liquid level of the stored second resin material intersects the first surface, and the semiconductor substrate to which the support substrate is attached may be pulled out of the stored second resin material so that the liquid level of the stored second resin material intersects the first surface. Accordingly, for example, compared to when immersion in and pulling out of the second resin material are performed while the liquid level of the stored second resin material and the first surface of the semiconductor substrate are parallel to each other, it is possible to reduce stress generated in a peripheral portion of the through hole. In addition, for example, compared to when immersion in and pulling out of the second resin material are performed while the liquid level of the stored second resin material and the first surface of the semiconductor substrate are parallel to each other, it is possible to prevent bubbles from remaining on the resin protective layer formed on a region corresponding to the through hole.

In the method of manufacturing a semiconductor device according to one aspect of the present invention, in the eighth process, the dip coating method may be performed using the second resin material having a viscosity of 10 cp or more. Accordingly, it is possible to form the resin protective layer having a sufficient thickness at which the second wiring can be protected more reliably.

In the method of manufacturing a semiconductor device according to one aspect of the present invention, in the ninth process, the second resin material adhered to a surface of the support substrate on the side opposite the semiconductor substrate in the eighth process may be removed. Accordingly, for example, when the semiconductor device is an optical device, even if a light transmitting substrate is used as the support substrate, since the second resin material is removed from the support substrate, the support substrate can effectively function as the light transmitting substrate.

In the method of manufacturing a semiconductor device according to one aspect of the present invention, the first resin material and the second resin material may be the same. Accordingly, even if the resin insulating layer and the resin protective layer are deformed due to a change in temperature, since the degrees of deformation are the same, it is possible to prevent damage to the second wiring caused by a large difference between the degrees of deformation.

Advantageous Effects of Invention

According to the present invention, it is possible to provide a method of manufacturing a semiconductor device through which it is possible to prevent damage to a peripheral portion of a through hole while thinning a semiconductor substrate, and it is possible to ensure electrical insulation between a wiring in the through hole and the semiconductor substrate.

Figure 1:
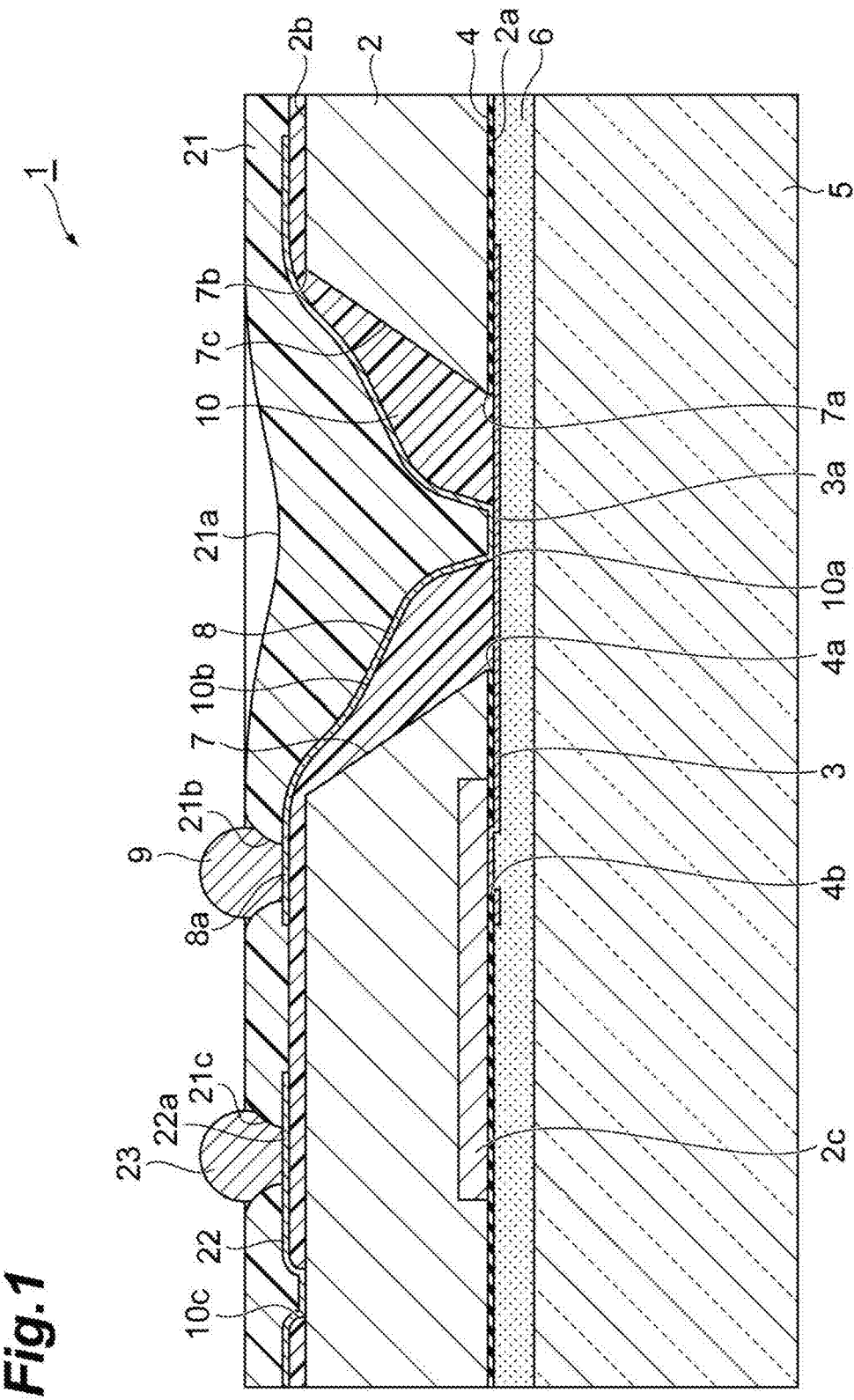
FIG. 1 is a cross-sectional view of a semiconductor device according to an embodiment of the present invention.
Figure 4:
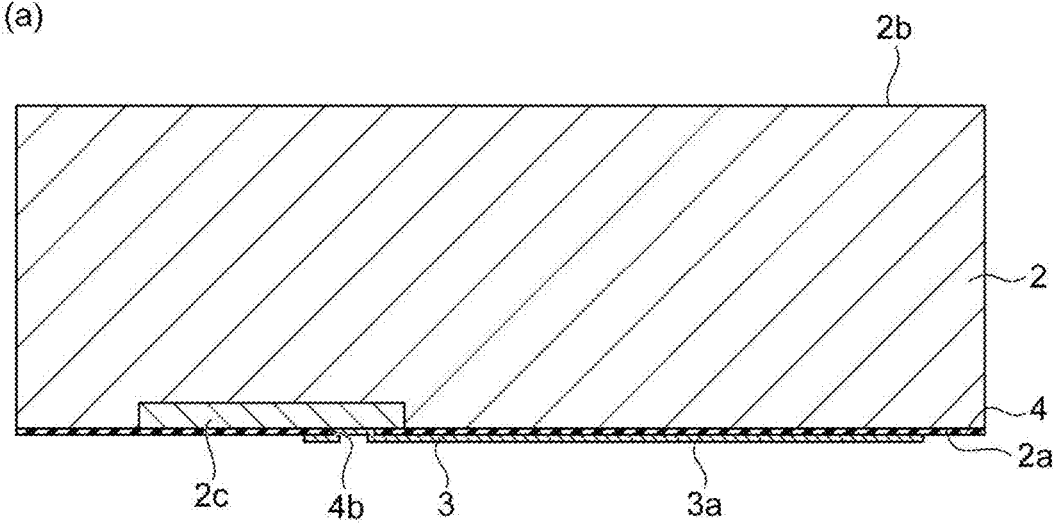
Figure 4:
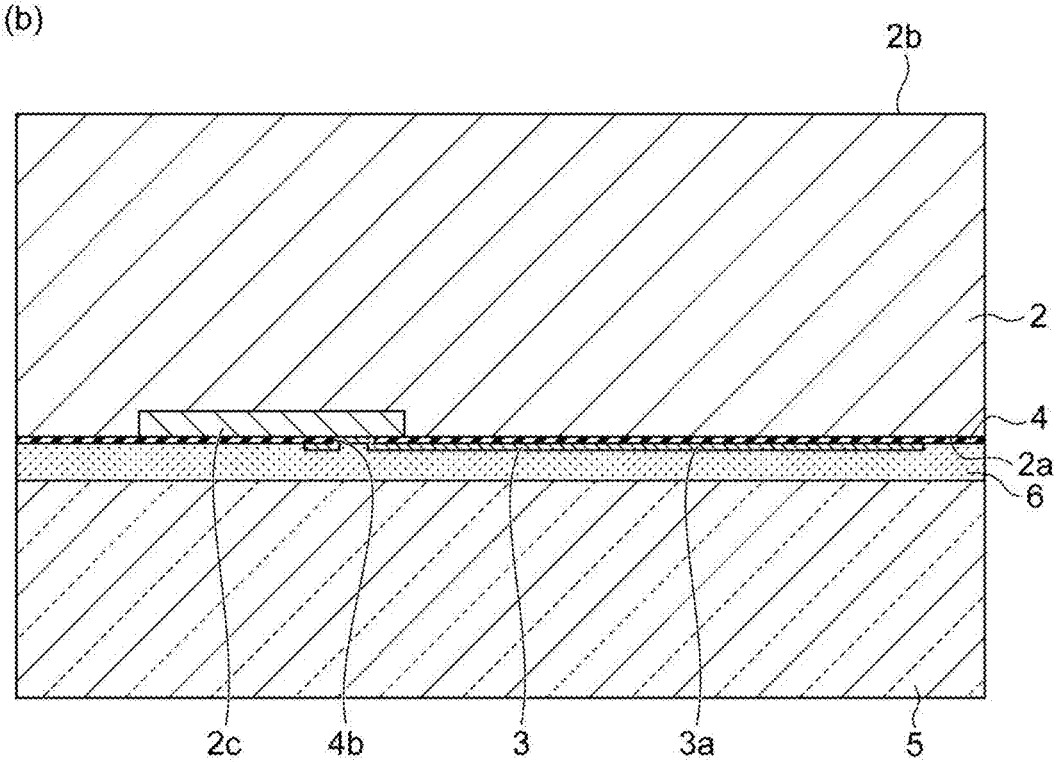

(a) and (b) of FIG. 4 are cross-sectional views for describing one process in a method of manufacturing the semiconductor device in FIG. 1.

Figure 5:
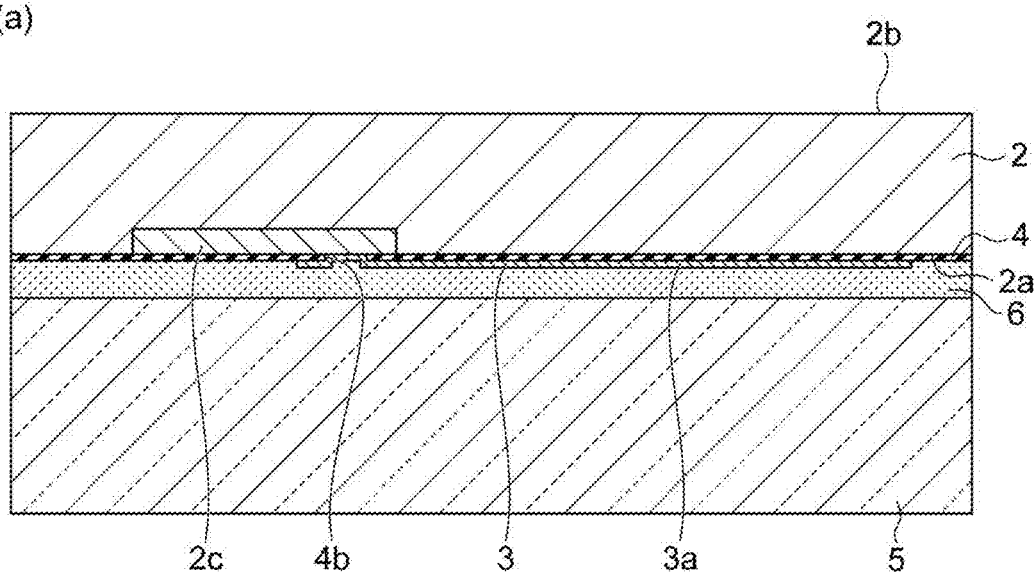
Figure 5:
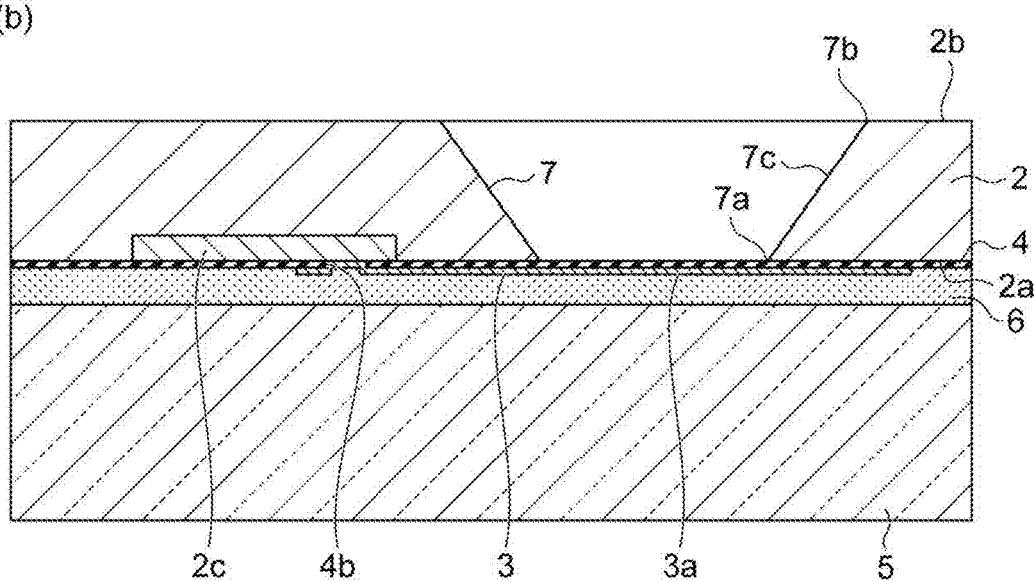

(a) and (b) of FIG. 5 are cross-sectional views for describing one process in the method of manufacturing the semiconductor device in FIG. 1.

Figure 6:
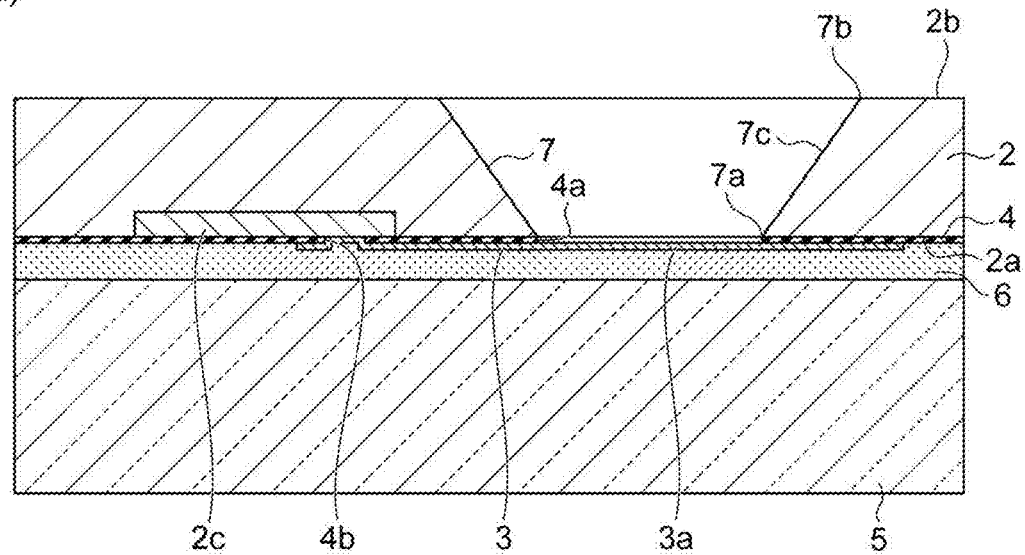
Figure 6:
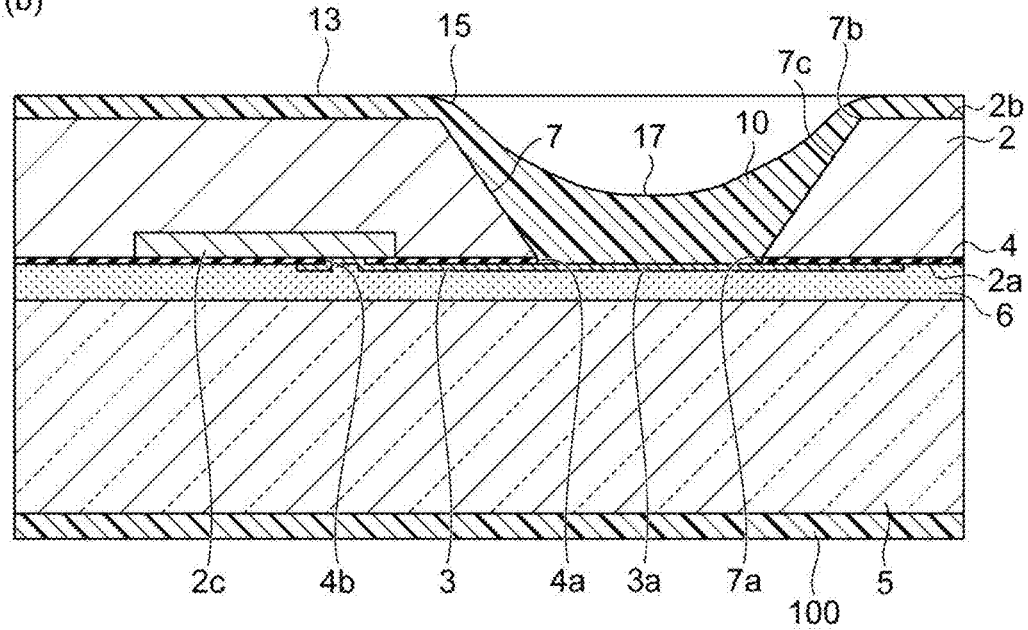

(a) and (b) of FIG. 6 are cross-sectional views for describing one process in the method of manufacturing the semiconductor device in FIG. 1.

Figure 7:
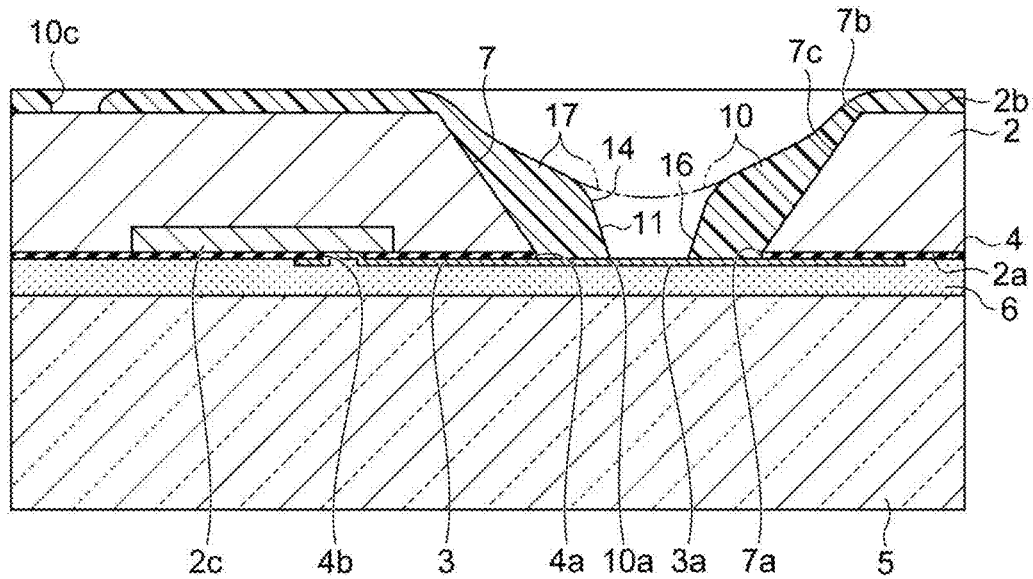
Figure 7:
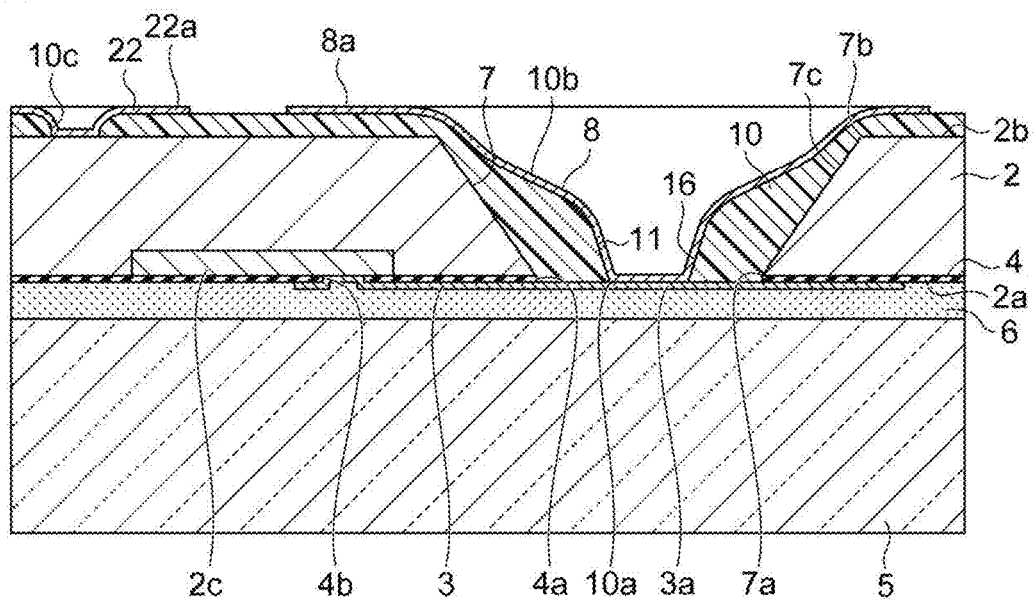

(a) and (b) of FIG. 7 are cross-sectional views for describing one process in the method of manufacturing the semiconductor device in FIG. 1.

Figure 8:
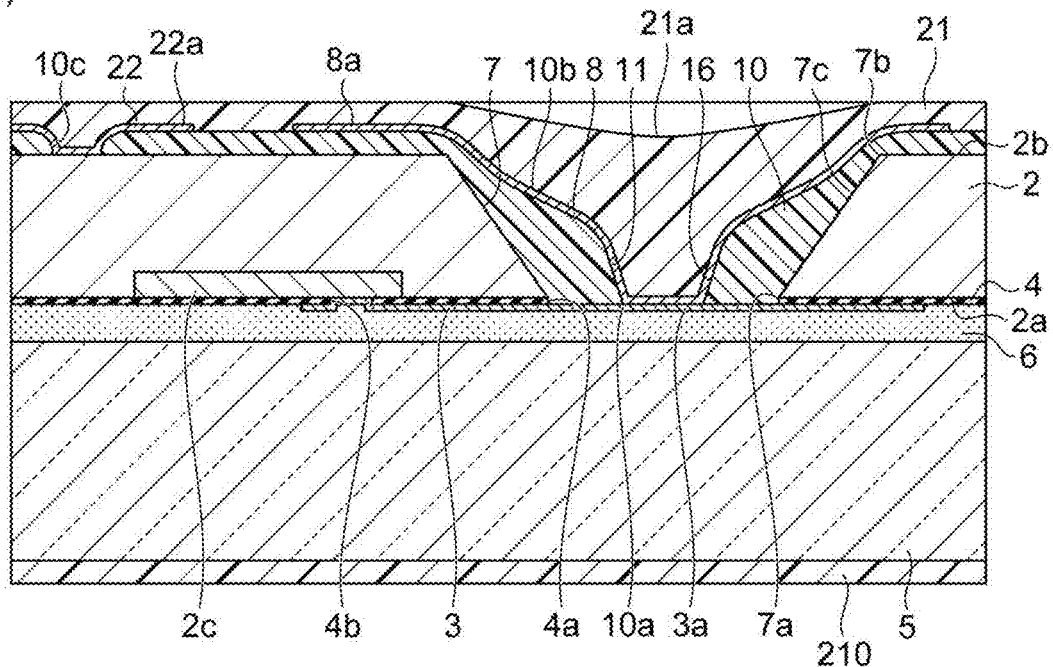
Figure 8:
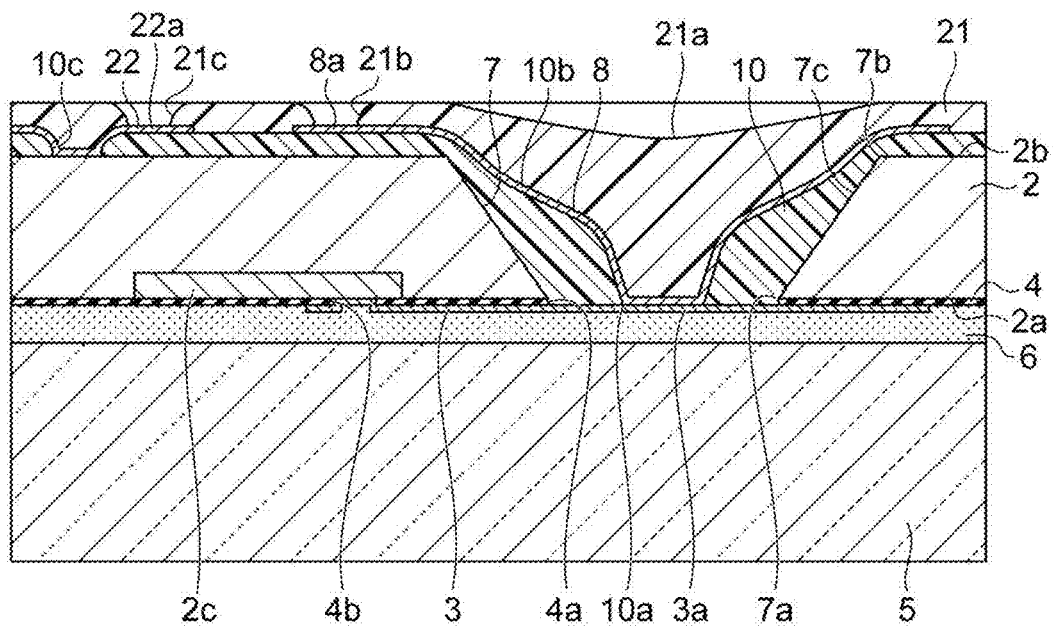

(a) and (b) of FIG. 8 are cross-sectional views for describing one process in the method of manufacturing the semiconductor device in FIG. 1.

Figure 9:
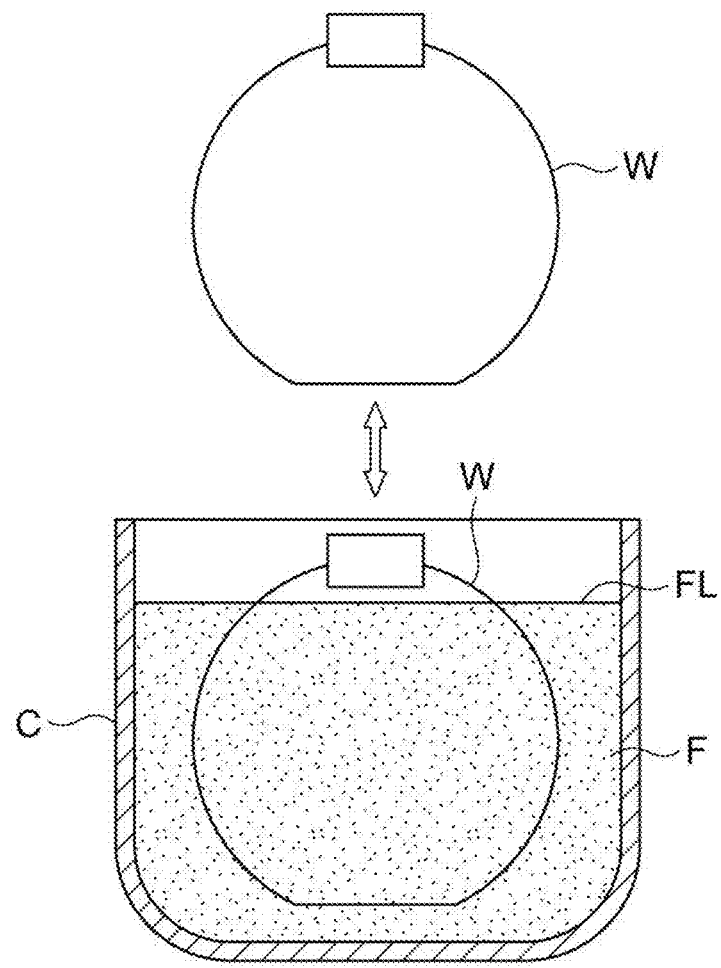

FIG. 9 is a cross-sectional view for describing one process in the method of manufacturing the semiconductor device in FIG. 1.

Figure 10:
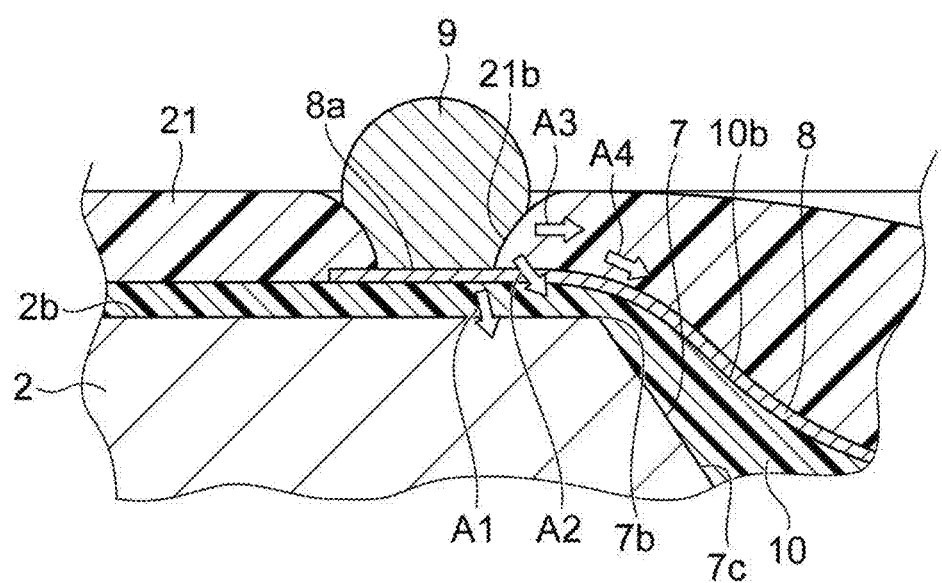

FIG. 10 is a partial cross-sectional view of the semiconductor device in FIG. 1.

Figure 11:
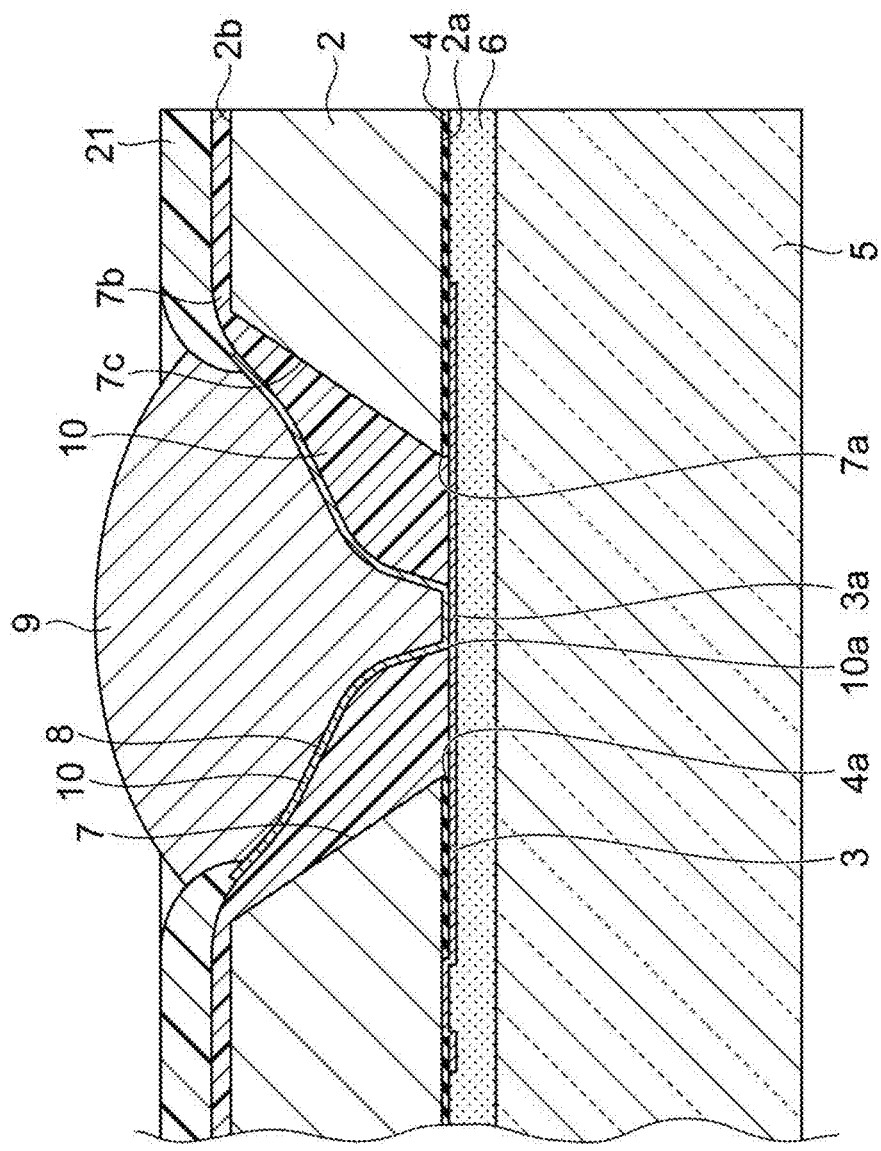

FIG. 11 is a partial cross-sectional view of a modified example of the semiconductor device in FIG. 1.

Figure 12:
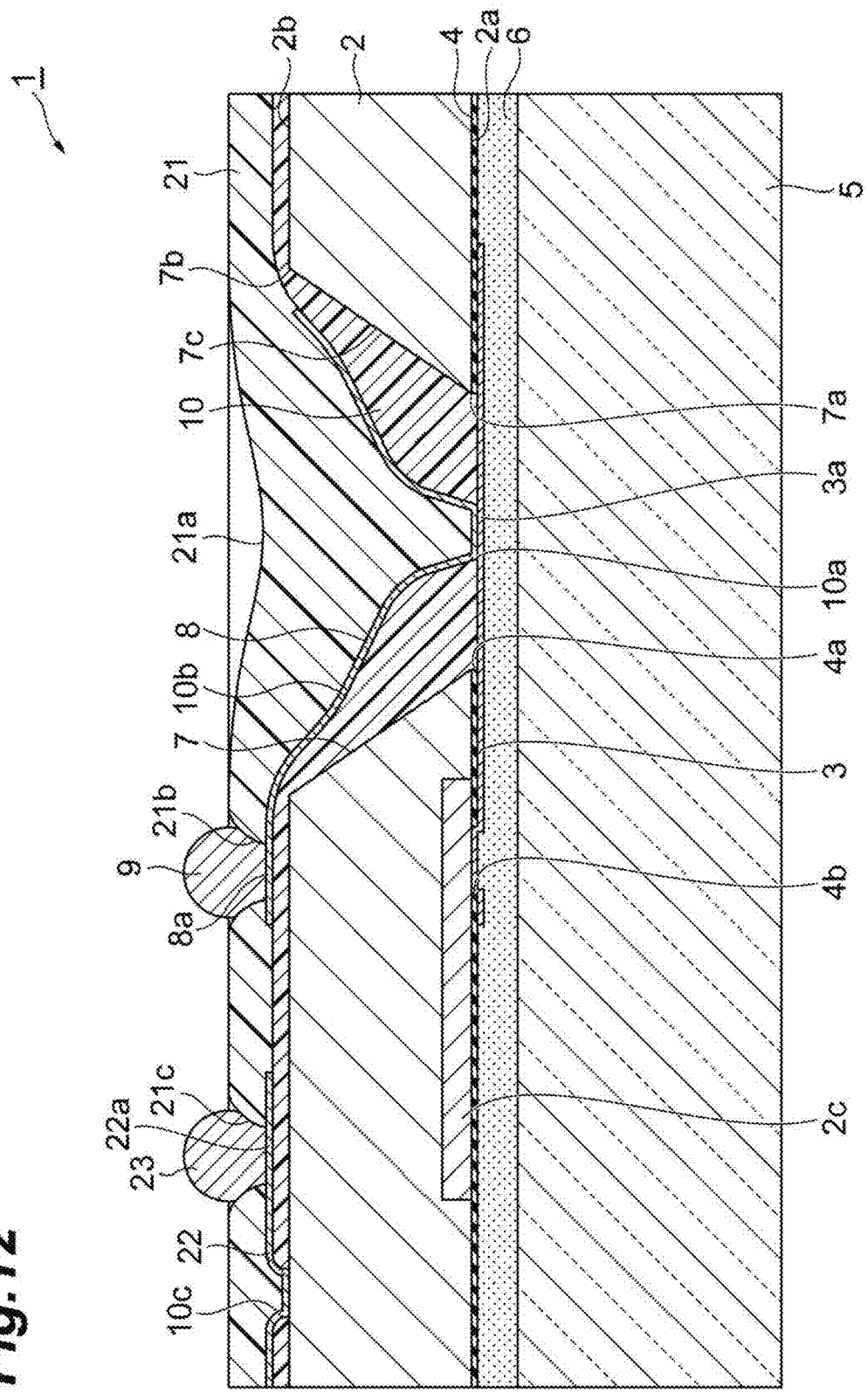

FIG. 12 is a partial cross-sectional view of a modified example of the semiconductor device in FIG. 1.

Figure 13:
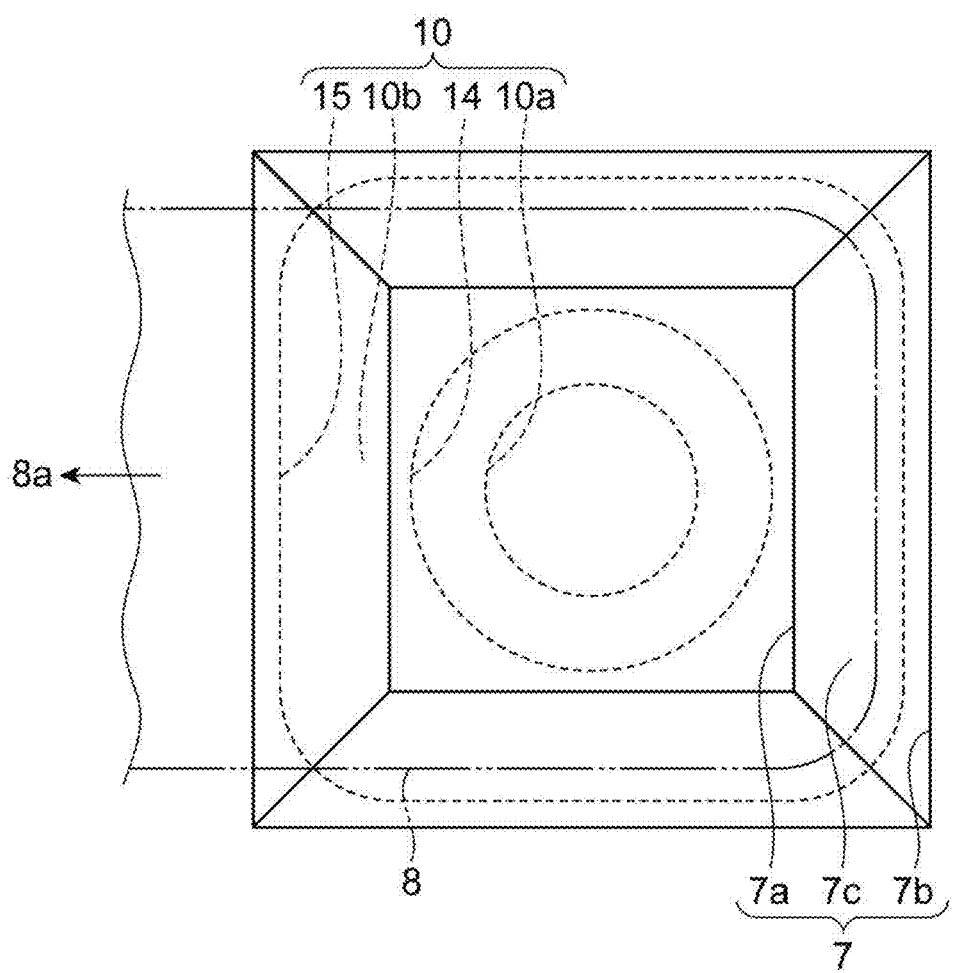

FIG. 13 is a plan view of a through hole of the semiconductor device in FIG. 12 and a peripheral portion thereof.

Figure 14:
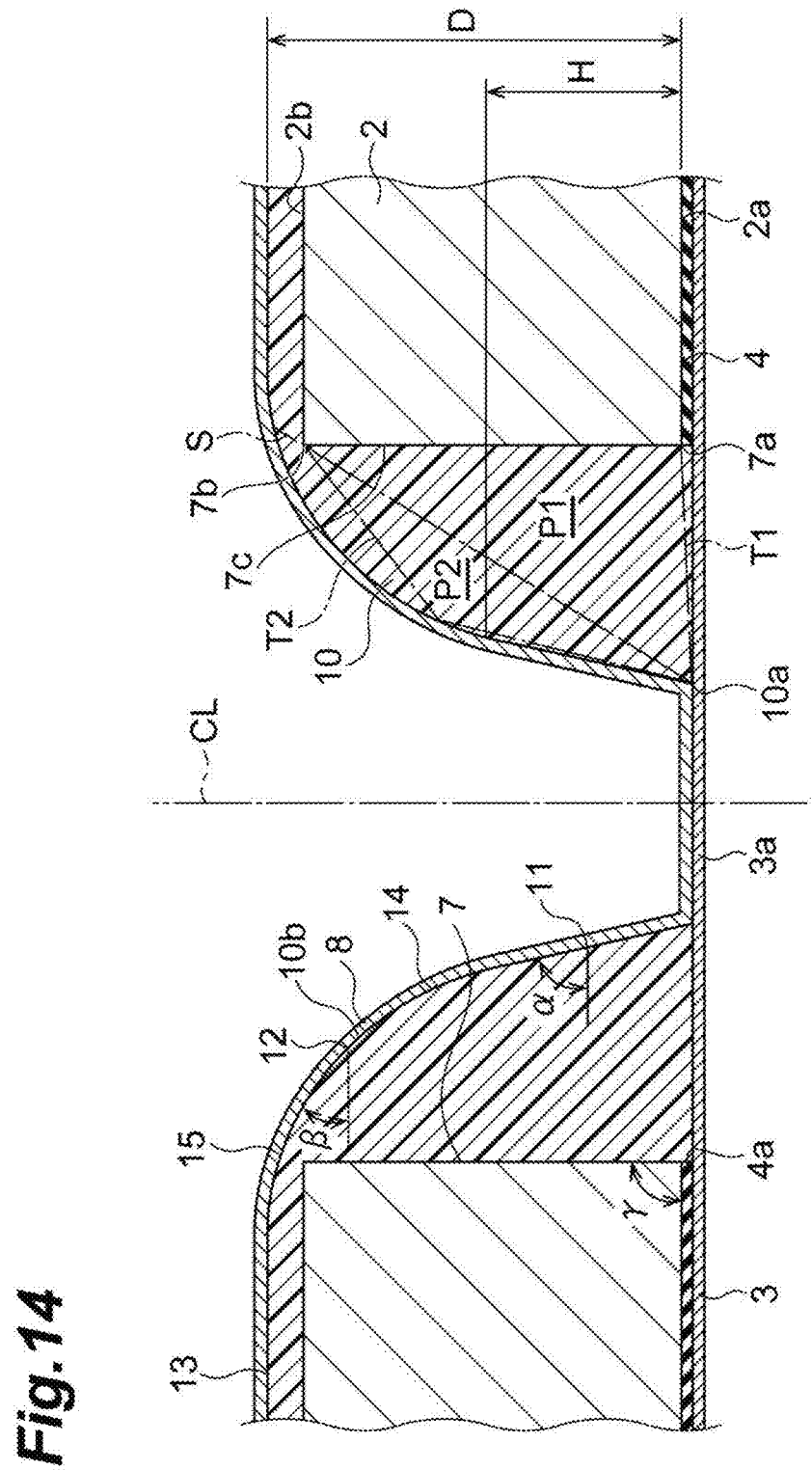

FIG. 14 is a cross-sectional view of a modified example of the through hole of the semiconductor device in FIG. 1 and a peripheral portion thereof.

DESCRIPTION OF EMBODIMENTS

Embodiments of the present invention will be described below in detail with reference to the drawings. Here, the same or corresponding portions in the drawings are denoted with the same reference numerals and redundant descriptions thereof will be omitted.

As shown in FIG. 1, a semiconductor device 1 includes a semiconductor substrate 2 including a first surface 2a and a second surface 2b that are opposite to each other. The semiconductor device 1 is an optical device, for example, a silicon photodiode. In the semiconductor device 1, in a predetermined region on the first surface 2a side in the semiconductor substrate 2 made of, for example, N-type silicon, a P-type region 2c in which P-type impurities are selectively diffused is provided. On the first surface 2a of the semiconductor substrate 2, a first wiring 3 made of, for example, aluminum, is provided with an oxide film 4 therebetween. In the oxide film 4, an opening 4a is formed in a portion corresponding to a pad portion 3a of the first wiring 3. An opening 4b is forming in a portion corresponding to an end of the P-type region 2c in the oxide film 4. The first wiring 3 is electrically connected to the P-type region 2c through the opening 4b. Here, instead of the oxide film 4, an insulating film made of another insulating material such as SiN may be provided.

A light transmitting substrate 5 made of a light transmitting material such as glass is arranged on the first surface 2a of the semiconductor substrate 2. The semiconductor substrate 2 and the light transmitting substrate 5 are optically and physically connected by an adhesive layer 6 including an optical adhesive. In the semiconductor device 1, light enters the P-type region 2c through the light transmitting substrate 5 and the adhesive layer 6. Here, the thickness of the semiconductor substrate 2 is smaller (thinner) than the thickness of the light transmitting substrate 5. As an example, the thickness of the semiconductor substrate 2 is about several tens of μm, and the thickness of the light transmitting substrate 5 is about several hundreds of μm.

In the semiconductor substrate 2, a through hole 7 to extend from the first surface 2a to the second surface 2b is formed. A first opening 7a of the through hole 7 is positioned on the first surface 2a of the semiconductor substrate 2, and a second opening 7b of the through hole 7 is positioned on the second surface 2b of the semiconductor substrate 2. The first opening 7a is continuous with the opening 4a of the oxide film 4 and is covered with the pad portion 3a of the first wiring 3. An inner surface 7c of the through hole 7 is a tapered surface that enlarges from the first surface 2a to the second surface 2b. For example, the through hole 7 is formed in a truncated quadrangular pyramid shape that enlarges from the first surface 2a to the second surface 2b. Here, when viewed in a direction parallel to a center line CL of the through hole 7, there is no need to match an edge of the first opening 7a of the through hole 7 and an edge of the opening 4a of the oxide film 4. For example, the edge of the opening 4a of the oxide film 4 may be positioned further inside than the edge of the first opening 7a of the through hole 7.

The aspect ratio of the through hole 7 is 0.2 to 10. The aspect ratio is a value obtained by dividing the depth of the through hole 7 (the distance between the first opening 7a and the second opening 7b) by the width of the second opening 7b (the distance between opposite sides of the second opening 7b when the second opening 7b has a rectangular shape, and the diameter of the second opening 7b when the second opening 7b has a circular shape). As an example, the depth of the through hole 7 is 30 μm, and the width of the second opening 7b is 130 pan. In this case, the aspect ratio is 0.23.

A resin insulating layer 10 is provided on the inner surface 7c of the through hole 7 and the second surface 2b of the semiconductor substrate 2. The resin insulating layer 10 is continuous through the second opening 7b of the through hole 7. The resin insulating layer 10 reaches the pad portion 3a of the first wiring 3 through the opening 4a of the oxide film 4 inside the through hole 7 and has an opening 10a on the first surface 2a side of the semiconductor substrate 2.

On a surface 10b (a surface on the side opposite the inner surface 7c of the through hole 7 and the second surface 2b of the semiconductor substrate 2) of the resin insulating layer 10, a second wiring 8 made of, for example, aluminum, is provided. The second wiring 8 is electrically connected to the pad portion 3a of the first wiring 3 in the opening 10a of the resin insulating layer 10. Further, on the surface 10b (a surface on the side opposite the second surface 2b of the semiconductor substrate 2) of the resin insulating layer 10, a third wiring 22 made of, for example, aluminum, is provided. The third wiring 22 is electrically connected to the second surface 2b of the semiconductor substrate 2 in an opening 10c formed in the resin insulating layer 10.

The second wiring 8 and the third wiring 22 are covered with a resin protective layer 21. A shallow recess 21a having a smooth inner surface is formed in a portion corresponding to the through hole 7 in the resin protective layer 21. An opening 21b for exposing a pad portion 8a is formed in a portion corresponding to the pad portion 8a of the second wiring 8 in the resin protective layer 21. An opening 21c for exposing the pad portion 22a is formed in a portion corresponding to a pad portion 22a of the third wiring 22 in the resin protective layer 21. In the opening 21b of the resin protective layer 21, an extraction electrode 9 that is a bump electrode is arranged. The extraction electrode 9 is electrically connected to the pad portion 8a of the second wiring 8. In the opening 21c of the resin protective layer 21, an extraction electrode 23 that is a bump electrode is arranged. The extraction electrode 23 is electrically connected to the pad portion 22a of the third wiring 22. The semiconductor device 1 is mounted on a circuit substrate through the extraction electrode 9 and the extraction electrode 23. The extraction electrode 9 and the extraction electrode 23 function as an anode electrode and a cathode electrode, respectively. Here, instead of the resin protective layer 21, a protective layer (for example, an oxide film and a nitride film) made of another insulating material may be provided. In addition, the thickness of the resin protective layer 21 may be almost the same as the thickness of the resin insulating layer 10 or may be smaller than the thickness of the resin insulating layer 10. In particular, when the thickness of the resin protective layer 21 is almost the same as the thickness of the resin insulating layer 10, it is possible to reduce stress applied to the second wiring 8 and the third wiring 22.

The resin insulating layer 10 described above will be described in further detail with reference to FIG. 2. Here, in FIG. 2, the light transmitting substrate 5, the adhesive layer 6, and the resin protective layer 21 are not shown.

Figure 2:
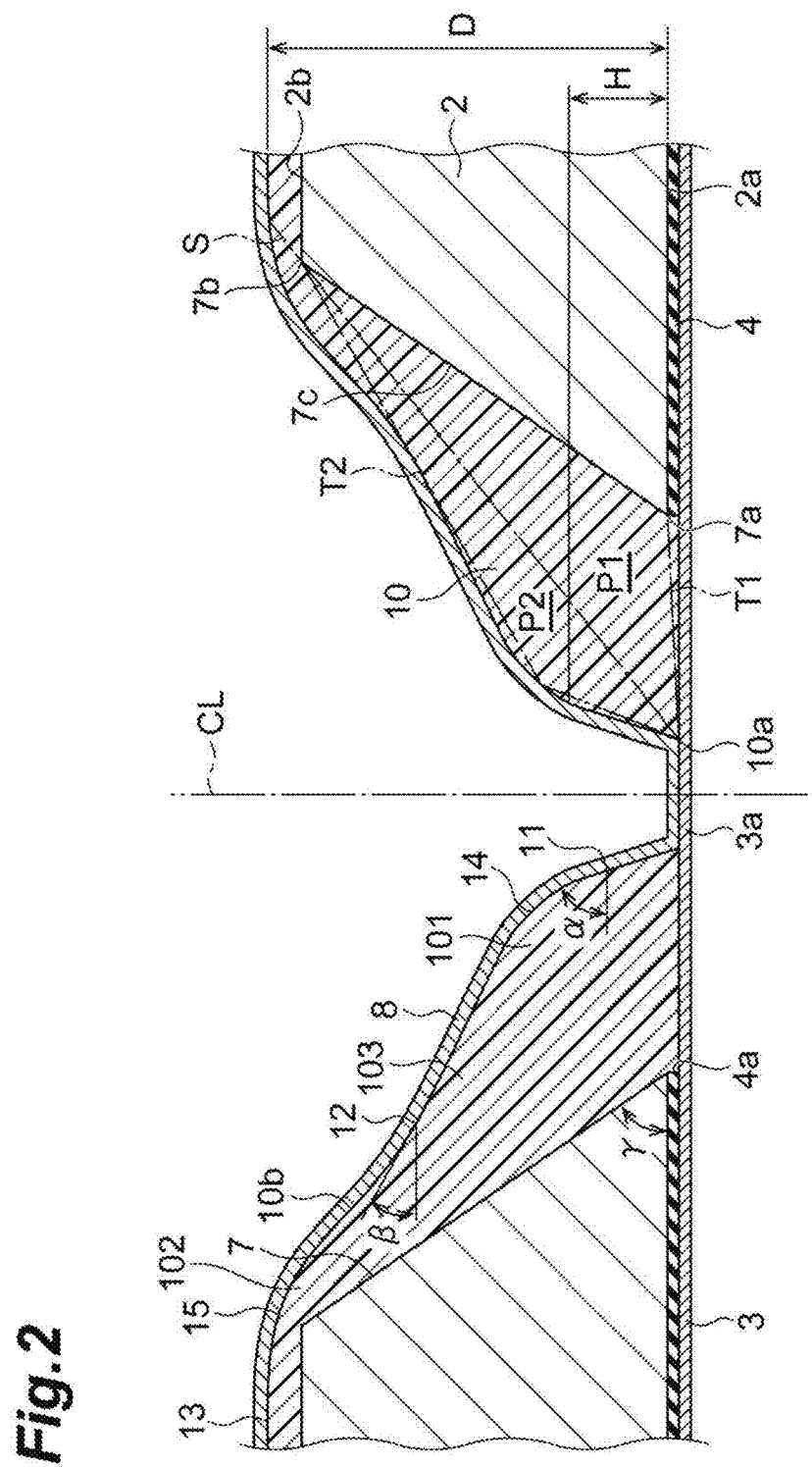
FIG. 2 is a cross-sectional view of a through hole of the semiconductor device in FIG. 1 and a peripheral portion thereof.

As shown in FIG. 2, the surface 10b of the resin insulating layer 10 has a first region 11 that reaches the first opening 7a inside the through hole 7, a second region 12 that reaches the second opening 7b inside the through hole 7, and a, third region 13 that faces the second surface 2b of the semiconductor substrate 2 outside the through hole 7.

The first region 11 is a tapered region that enlarges from the first surface 2a to the second surface 2b of the semiconductor substrate 2. The first region 11 has an average inclination angle α. When attention is paid to a region on one side of the center line CL in the plane including the center line CL of the through hole 7, the average inclination angle α of the first region 11 is an average value of angles formed between an intersection line between the plane and the first region 11, and the first surface 2a. When the intersection line is a straight line, an angle between the straight line and the first surface 2a is the average inclination angle α of the first region 11. When the intersection line is a curved line, an average value of angles between the tangent of the curved line and the first surface 2a is the average inclination angle α of the first region 11. The average inclination angle α of the first region 11 is greater than 0° and smaller than 90°.

The second region 12 is a tapered region that enlarges from the first surface 2a to the second surface 2b of the semiconductor substrate 2. The second region 12 has an average inclination angle β. When attention is paid to a region on one side of the center line CL in the plane including the center line CL of the through hole 7, the average inclination angle β of the second region 12 is an average value of angles between an intersection line between the plane and the second region 12, and the first surface 2a. When the intersection line is a straight line, an angle between the straight line and the first surface 2a is the average inclination angle β of the second region 12. When the intersection line is a curved line, an average value of angles between the tangent of the curved line and the first surface 2a is the average inclination angle β of the second region 12. The average inclination angle β of the second region 12 is greater than 0° and smaller than 90°.

The average inclination angle β of the second region 12 is smaller than the average inclination angle α of the first region 11. That is, the second region 12 is a region having a gentler inclination than the first region 11. In addition, the average inclination angle β of the second region 12 is smaller than an average inclination angle γ of the inner surface 7c of the through hole 7. That is, the second region 12 is a region having a gentler inclination than the inner surface 7c of the through hole 7. In the present embodiment, the average inclination angle α of the first region 11 is closer to the average inclination angle γ of the inner surface 7c of the through hole 7 than the average inclination angle β of the second region 12. Here, the relationship of the average inclination angle α of the first region 11>the average inclination angle γ of the inner surface 7c of the through hole 7>the average inclination angle β of the second region 12 is established. When attention is paid to a region on one side of the center line CL in the plane including the center line CL of the through hole 7, the average inclination angle γ of the inner surface 7c of the through hole 7 is an average value of angles between an intersection line between the plane and the inner surface 7c, and the first surface 2a. When the intersection line is a straight line, an angle between the straight line and the first surface 2a is the average inclination angle γ of the inner surface 7c of the through hole 7. When the intersection line is a curved line, an average value of angles between the tangent of the curved line and the first surface 2a is the average inclination angle γ of the inner surface 7c of the through hole 7.

The surface 10b of the resin insulating layer 10 further has a fourth region 14 having a maximum convex curvature toward the side opposite the inner surface 7c of the through hole 7 and a fifth region 15 along an edge of the second opening 7b of the through hole 7. When attention is paid to a region on one side of the center line CL in the plane including the center line CL of the through hole 7, the maximum convex curvature toward the side opposite the inner surface 7c of the through hole 7 is a maximum curvature value of a portion that is curved in a convex shape toward the side opposite the inner surface 7c of the through hole 7 along the intersection line between the plane and the surface 10b. Here, the first region 11 is a region on the first opening 7a side of the through hole 7 (the first opening 7a side in a direction parallel to the center line CL of the through hole 7) relative to the fourth region 14 within the surface 10b of the resin insulating layer 10 provided on the inner surface 7c of the through hole 7. The second region 12 is a region on the second opening 7b side of the through hole 7 (the second opening 7b side in a direction parallel to the center line CL of the through hole 7) relative to the fourth region 14 within the surface 10b of the resin insulating layer 10 provided on the inner surface 7c of the through hole 7 (that is, a region between the fourth region 14 and the fifth region 15).

The fourth region 14 is curved to continuously connect the first region 11 and the second region 12. That is, the fourth region 14 is a rounded curved surface and smoothly connects the first region 11 and the second region 12. Here, if it is assumed that the fourth region 14 is not provided, when the first region 11 is extended to the second surface 2b side of the semiconductor substrate 2, and the second region 12 is extended to the first surface 2a side of the semiconductor substrate 2, an intersection line (a corner or an angulated portion) is formed by the first region 11 and the second region 12. The fourth region 14 corresponds to a curved surface formed when the intersection line (a corner or an angulated portion) is round-chamfered. When attention is paid to a region on one side of the center line CL in the plane including the center line CL of the through hole 7, the fourth region 14 is a portion that is curved in a convex shape toward the side opposite the inner surface 7c of the through hole 7 between a portion corresponding to the first region 11 and a portion corresponding to the second region 12 along the intersection line between the plane and the surface 10b.

The fifth region 15 is curved to continuously connect the second region 12 and the third region 13. That is, the fifth region 15 is a rounded curved surface and smoothly connects the second region 12 and the third region 13. Here, if it is assumed that the fifth region 15 is not provided, when the second region 12 is extended to the second surface 2b side of the semiconductor substrate 2 and the third region 13 is extended to the center line CL of the through hole 7, an intersection line (such as a corner or an angulated portion) is formed by the second region 12 and the third region 13. The fifth region 15 corresponds to a curved surface formed when the intersection line (such as a corner or an angulated portion) is round-chamfered. When attention is paid to a region on one side of the center line CL in the plane including the center line CL of the through hole 7, the fifth region 15 is a portion that is curved in a convex shape toward the side opposite the edge of the second opening 7b of the through hole 7 between the portion corresponding to the second region 12 and a portion corresponding to the third region 13 along the intersection line between the plane and the surface 1013.

In the present embodiment, the first region 11, the fourth region 14, and the fifth region 15 are curved surfaces that are curved in a convex shape toward the side opposite the inner surface 7c of the through hole 7. The second region 12 is a curved surface that is curved in a convex shape toward the inner surface 7c side of the through hole 7 (that is, a curved surface that is curved in a concave shape when viewed from the side opposite the inner surface 7c of the through hole 7). The third region 13 is a plane substantially parallel to the second surface 2b of the semiconductor substrate 2. As described above, the fourth region 14 is curved to continuously connect the first region 11 and the second region 12, and the fifth region 15 is curved to continuously connect the second region 12 and the third region 13. Therefore, the surface 10b of the resin insulating layer 10 is a continuous surface (a surface in which there is no discontinuous portion such as an intersection line (such as a corner or an angulated portion) between a surface and a surface, and the regions 11, 12, 13, 14, and 15 are smoothly connected).

An average thickness of the resin insulating layer 10 provided on the inner surface 7c of the through hole 7 is greater than an average thickness of the resin insulating layer 10 provided on the second surface 2b of the semiconductor substrate 2. The average thickness of the resin insulating layer 10 provided on the inner surface 7c of the through hole 7 is an average value of the thickness of the resin insulating layer 10 in a direction perpendicular to the inner surface 7c. The average thickness of the resin insulating layer 10 provided on the second surface 2b of the semiconductor substrate 2 is an average value of the thickness of the resin insulating layer 10 in a direction perpendicular to the second surface 2b.

In a direction parallel to the first surface 2a and the second surface 2b of the semiconductor substrate 2, an average thickness of the portion corresponding to the first region 11 within the resin insulating layer 10 is greater than an average thickness of the portion corresponding to the second region 12 within the resin insulating layer 10. In a direction parallel to the first surface 2a and the second surface 2b of the semiconductor substrate 2, an average thickness of the portion corresponding to the first region 11 within the resin insulating layer 10 is an average value of a distance between the first region 11 and the inner surface 7c of the through hole 7 in that direction. In a direction parallel to the first surface 2a and the second surface 2b of the semiconductor substrate 2, an average thickness of the portion corresponding to the second region 12 within the resin insulating layer 10 is an average value of a distance between the second region 12 and the inner surface 7c of the through hole 7 in that direction.

In the resin insulating layer 10, the first region 11 is a surface of a portion having a height H from the first surface 2a of the semiconductor substrate 2 within the resin insulating layer 10 provided on the inner surface 7c of the through hole 7. The height H is 1/2 of a sum D of the thickness of the semiconductor substrate 2 (that is, a distance between the first surface 2a and the second surface 2b) and the average thickness of the resin insulating layer 10 provided on the second surface 2b of the semiconductor substrate 2 or less.

In the resin insulating layer 10, when a surface S passing through an edge of the opening 10a of the resin insulating layer 10 and the edge of the second opening 7b of the through hole 7 is set as a boundary surface, and a portion P1 on the inner surface 7c side of the through hole 7 with respect to the surface S and a portion P2 on the side opposite the inner surface 7c of the through hole 7 with respect to the surface S are focused on, the volume of the portion P1 is larger than the volume of the portion P2. In addition, in the resin insulating layer 10, when attention is paid to a region on one side of the center line CL in the plane including the center line CL of the through hole 7, an area of a triangle T1 is larger than an area of a triangle T2. The triangle T1 is a triangle with vertices at the edge of the first opening 7a of the through hole 7, the edge of the second opening 7b of the through hole 7, and the edge of the opening 10a of the resin insulating layer 10 on a plane including the center line CL of the through hole 7 (that is, in the cross section in FIG. 2). The triangle T2 is a triangle with vertices at the edge of the opening 10a of the resin insulating layer 10, the edge of the second opening 7b of the through hole 7, and the top of the fourth region 14 on a plane including the center line CL of the through hole 7 (that is, in the cross section in FIG. 2).

The resin insulating layer 10 has a first curved portion 101, a second curved portion 102, and a third curved portion 103. The first curved portion 101 covers the inner surface 7c of the through hole 7 between the first opening 7a and the second opening 7b. The second curved portion 102 covers the edge of the second opening 7b of the through hole 7 (that is, an intersection line between the second surface 2b of the semiconductor substrate 2 and the inner surface 7c of the through hole). The second curved portion 102 is formed to cross the second surface 2b of the semiconductor substrate 2 and the inner surface 7c of the through hole. In the present embodiment, regardless of whether the shape of the edge of the second opening 7b is a rectangle or a circle, the edge of the second opening 7b is not chamfered but has a corner (edge). The second curved portion 102 covers the corner. The third curved portion 103 covers the inner surface 7c of the through hole 7 between the first curved portion 101 and the second curved portion 102. The first curved portion 101 and the third curved portion 103 are separated from each other. The second curved portion 102 and the third curved portion 103 are separated from each other. The surface 10b of the resin insulating layer 10 (corresponds to the fourth region 14 in the present embodiment) in the first curved portion 101 is curved in a convex shape toward the side opposite the inner surface 7c of the through hole 7. The surface 10b of the resin insulating layer 10 (corresponds to the fifth region 15 in the present embodiment) in the second curved portion 102 is curved in a convex shape toward the side opposite the inner surface 7c of the through hole 7. The surface 10b of the resin insulating layer 10 (corresponds to the second region 12 in the present embodiment) in the third curved portion 103 is curved in a convex shape toward the inner surface 7c side of the through hole 7 (that is, curved in a concave shape when viewed from the side opposite the inner surface 7c of the through hole 7). The curvature of the surface 10b of the resin insulating layer 10 in the first curved portion 101 and the curvature of the surface 10b of the resin insulating layer 10 in the second curved portion 102 are different from each other.

When attention is paid to a region on one side of the center line CL in the plane including the center line CL of the through hole 7, a convex curve to the side opposite the inner surface 7c of the through hole 7 means that an intersection line between the plane and the surface 10b is curved in a convex shape toward the side opposite the inner surface 7c of the through hole 7. When attention is paid to a region on one side of the center line CL in the plane including the center line CL of the through hole 7, a convex curve to the inner surface 7c side of the through hole 7 means that an intersection line between the plane and the surface 10b is curved in a convex shape toward the inner surface 7c side of the through hole 7.

Figure 3:
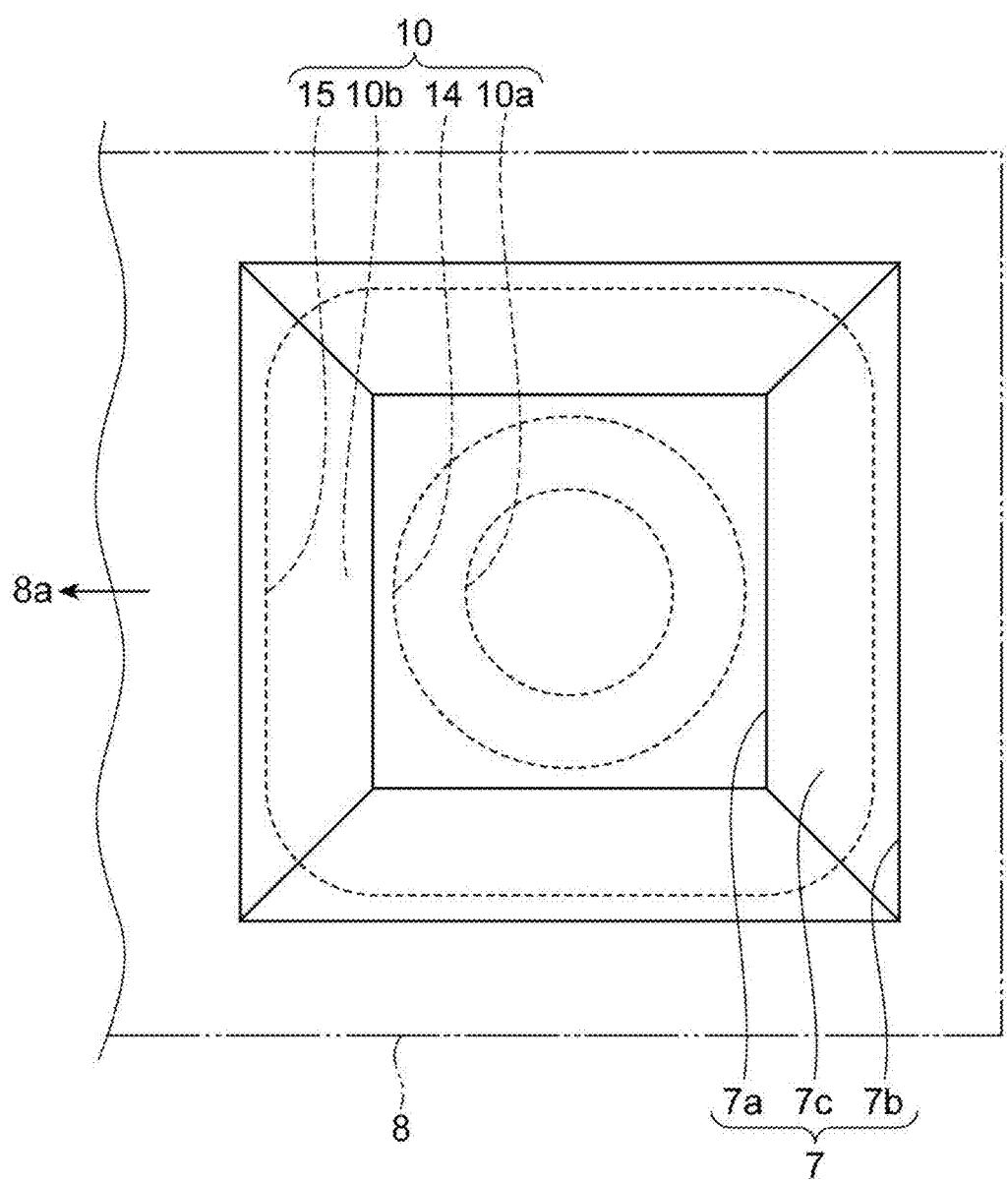
FIG. 3 is a plan view of a through hole of the semiconductor device in FIG. 1 and a peripheral portion thereof.

As shown in FIG. 3, when viewed in a direction parallel to the center line CL of the through hole 7, an outer edge of the second wiring 8 is positioned outside the second opening 7b of the through hole 7. That is, the outer edge of the second wiring 8 is positioned on a surface on the side opposite the second surface 2b of the semiconductor substrate 2 within the surface 10b of the resin insulating layer 10. Here, in FIG. 3, the resin insulating layer 10 is indicated by a dashed line, and the second wiring 8 is indicated by an alternate long and two short dashes line.

When the through hole 7 is formed in a truncated quadrangular pyramid shape that enlarges from the first surface 2a to the second surface 2b, on the surface 10b of the resin insulating layer 10 (corresponds to the fifth region 15 in the present embodiment) in the second curved portion 102, when viewed in a direction parallel to the center line CL of the through hole 7, a distance from each corner of the second opening 7b of the through hole 7 to the surface 10b is greater than a distance from each side of the second opening 7b of the through hole 7 to the surface 10b. Accordingly, at each corner of the second opening 7b of the through hole 7, since the second curved portion 102 becomes a gentler curved surface, it is possible to reliably prevent the edge of the second opening 7b of the through hole 7 from being exposed, and it is possible to prevent a current from leaking between the second wiring 8 and the semiconductor substrate 2 more reliably.

In addition, on the surface 10b of the resin insulating layer 10 (corresponds to the fourth region 14 in the present embodiment) in the first curved portion 101, when viewed in a direction parallel to the center line CL of the through hole 7, a distance from each corner of the first opening 7a of the through hole 7 to the surface 10b is greater than a distance from each side of the first opening 7a of the through hole 7 to the surface 10b. Further, when viewed in a direction parallel to the center line CL of the through hole 7, regarding a distance between the surface 10b of the resin insulating layer 10 (corresponds to the fifth region 15 in the present embodiment) in the second curved portion 102 and the surface 10b of the resin insulating layer 10 (corresponds to the fifth region 15 in the present embodiment) in the second curved portion 102, the distance at each corner of the first opening 7a of the through hole 7 is greater than the distance at each side of the first opening 7a of the through hole 7. Accordingly, while a corner (valley) of the through hole 7 having a truncated quadrangular pyramid shape is a portion in which an insulating film easily becomes thinner, it is possible to ensure a sufficient thickness of the resin insulating layer 10 at the corner (valley).

As described above, in the semiconductor device 1, the resin insulating layer 10 has the second curved portion 102 that covers the edge of the second opening 7b of the through hole 7, and the surface 10b in the second curved portion 102 is curved in a convex shape toward the side opposite the inner surface 7c of the through hole 7. Accordingly, the surface 10b of the resin insulating layer 10 provided on the inner surface 7c of the through hole 7 and the surface 10b of the resin insulating layer 10 provided on the second surface 2b of the semiconductor substrate 2 are smoothly connected. Therefore, during manufacture and after manufacture, a disconnection of the second wiring 8 in a portion of the second opening 7b of the through hole 7 is prevented. In addition, the resin insulating layer 10 has the first curved portion 101 that covers the inner surface 7c of the through hole 7 between the first opening 7a and the second opening 7b. The surface 10b in the first curved portion 101 is curved in a convex shape toward the side opposite the inner surface 7c of the through hole 7. Accordingly, for example, even if the diameter of the through hole 7 is reduced, a sufficient area of the opening 10a of the resin insulating layer 10 on the first surface 2a side of the semiconductor substrate 2 is ensured. Therefore, during manufacture and after manufacture, a disconnection between the first wiring 3 and the second wiring 8 in a portion of the opening 10a of the resin insulating layer 10 is prevented. Thus, according to the semiconductor device 1, a reliable electrical connection via the through hole 7 in the semiconductor substrate 2 can be formed.

In the semiconductor device 1, the resin insulating layer 10 further has the third curved portion 103 that covers the inner surface 7c of the through hole 7 between the first curved portion 101 and the second curved portion 102, and the surface 10b in the third curved portion 103 is curved in a convex shape toward the inner surface 7c side of the through hole 7. Accordingly, for example, even if some external force is applied to the first opening 7a side from the second opening 7b side of the through hole 7, the third curved portion 103 functions as a buffer region. Therefore, it is possible to reduce stress generated in a portion connecting the first wiring 3 and the second wiring 8, and it is possible to prevent a disconnection between the first wiring 3 and the second wiring 8 more reliably.

In the semiconductor device 1, the average thickness of the resin insulating layer 10 provided on the inner surface 7c of the through hole 7 is greater than the average thickness of the resin insulating layer 10 provided on the second surface 2b. Accordingly, for example, even if the semiconductor substrate 2 is thinned, since the resin insulating layer 10 provided on the inner surface 7c of the through hole 7 functions as a reinforcing layer, it is possible to ensure sufficient strength of a peripheral portion of the through hole 7. In addition, it is possible to set an average inclination angle of the first region 11 and an average inclination angle of the second region 12 to a desired angle, and it is possible to obtain the resin insulating layer 10 in which the surface 10b is a continuous surface (a surface in which there is no discontinuous portion such as an intersection line (such as a corner or an angulated portion) between a surface and a surface, and the regions 11, 12, 13, 14, and 15 are smoothly connected). For example, when the resin insulating layer 10 is formed with a uniform thickness along the inner surface 7c of the through hole 7, it is not possible to obtain the resin insulating layer 10 in which the surface 10b is a continuous surface.

In the semiconductor device 1, the inner surface 7c of the through hole 7 is a tapered surface that enlarges from the first surface 2a to the second surface 2b. In this case, a reliable electrical connection via the through hole 7 in the semiconductor substrate 2 can be formed.

In the semiconductor device 1, the first region 11 that reaches the first opening 7a of the through hole 7 and the second region 12 that reaches the second opening 7b of the through hole 7 within the surface 10b of the resin insulating layer 10 are tapered regions that enlarges from the first surface 2a to the second surface 2b of the semiconductor substrate 2. Thus, the average inclination angle of the second region 12 is smaller than an average inclination angle of the inner surface 7c of the through hole 7. Accordingly, an angle between the third region 13 that faces the second surface 2b of the semiconductor substrate 2 and the second region 12 that reaches the second opening 7b of the through hole 7 within the surface 10b of the resin insulating layer 10 is greater (that is, gentler) than an angle between the second surface 2b of the semiconductor substrate 2 and the inner surface 7c of the through hole 7. Therefore, during manufacture and after manufacture, a disconnection of the second wiring 8 in a portion of the second opening 7b of the through hole 7 is prevented. In addition, for example, compared to when the resin insulating layer 10 is formed with a uniform thickness along the inner surface 7c of the through hole 7, since the inclination of the second region 12 becomes gentler, it is possible to form the second wiring 8 easily and reliably. Further, since it is possible to form the second wiring 8 without depending on the shape of the inner surface 7c of the through hole 7, for example, even if a pointed portion remains on the inner surface 7c of the through hole 7, it is possible to prevent a disconnection of the second wiring 8 caused by such a portion. In addition, the average inclination angle of the second region 12 is smaller than the average inclination angle of the first region 11. In other words, the average inclination angle of the first region 11 that reaches the first opening 7a of the through hole 7 is greater than the average inclination angle of the second region 12. Accordingly, for example, even if the diameter of the through hole 7 is reduced, a sufficient area of the opening 10a of the resin insulating layer 10 on the first surface 2a side of the semiconductor substrate 2 is ensured. Therefore, during manufacture and after manufacture, a disconnection between the first wiring 3 and the second wiring 8 in a portion of the opening 10a of the resin insulating layer 10 is prevented. Further, on the surface 10b of the resin insulating layer 10, the fourth region 14 is curved to continuously connect the first region 11 and the second region 12, and the fifth region 15 is curved to continuously connect the second region 12 and the third region 13. Therefore, during manufacture and after manufacture, a disconnection of the second wiring 8 is prevented in the entire region of the surface 10b of the resin insulating layer 10. In particular, after manufacture, since the stress concentration in the entire region of the surface 10b of the resin insulating layer 10 is reduced, this is effective in preventing a disconnection of the second wiring 8. As described above, according to the semiconductor device 1, a reliable electrical connection via the through hole 7 in the semiconductor substrate 2 can be formed.

In the semiconductor device 1, the surface 10b of the resin insulating layer 10 is a continuous surface (a surface in which there is no discontinuous portion such as an intersection line (such as a corner or an angulated portion) between a surface and a surface, and the regions 11, 12, 13, 14, and 15 are smoothly connected). Accordingly, the stress concentration is reduced so that a disconnection of the second wiring 8 can be prevented.

In the semiconductor device 1, the average inclination angle of the first region 11 is closer to the average inclination angle of the inner surface 7c of the through hole 7 than the average inclination angle of the second region 12. Accordingly, it is possible to obtain the opening 10a having a sufficient area for exposing the pad portion 3a of the first wiring 3. As a result, during manufacture and after manufacture, it is possible to prevent a disconnection between the first wiring 3 and the second wiring 8 in a portion of the opening 10a of the resin insulating layer 10 more reliably.

In the semiconductor device 1, the relationship of the average inclination angle α of the first region 11>the average inclination angle γ of the inner surface 7c of the through hole 7>the average inclination angle β of the second region 12 is established. Accordingly, it is possible to prevent a disconnection of the second wiring 8 and it is possible to obtain the opening 10a having a sufficient area for exposing the pad portion 3a of the first wiring 3.

In the semiconductor device 1, in a direction parallel to the first surface 2a and the second surface 2b of the semiconductor substrate 2, an average thickness of the portion corresponding to the first region 11 within the resin insulating layer 10 is greater than an average thickness of the portion corresponding to the second region 12 within the resin insulating layer 10. Accordingly, it is possible to obtain the resin insulating layer 10 having a shape in which a disconnection of the second wiring 8 does not easily occur and a disconnection between the first wiring 3 and the second wiring 8 does not easily occur.

In the semiconductor device 1, for example, even if an overhang or the like remains on the edge of the second opening 7b of the through hole 7, the overhang or the like is covered with the resin insulating layer 10, and the second wiring 8 is provided on the fifth region 15 that is a curved surface curved in a convex shape. Accordingly, it is possible to reliably prevent a disconnection of the second wiring 8 in a portion of the second opening 7b of the through hole 7.

In the semiconductor device 1, within the resin insulating layer 10 provided on the inner surface 7c of the through hole 7, a surface of a portion having a height H that is ½ of a sum D of the thickness of the semiconductor substrate 2 and the average thickness of the resin insulating layer 10 provided on the second surface 2b or less is the first region 11. Accordingly, on the surface 10b of the resin insulating layer 10, the first region 11 and the second region 12 are smoothly connected, and it is possible to reliably prevent a disconnection of the second wiring 8 at a boundary between the first region 11 and the second region 12.

In the resin insulating layer 10 of the semiconductor device 1, when the surface S passing through the edge of the opening 10a of the resin insulating layer 10 and the edge of the second opening 7b of the through hole 7 is set as a boundary surface, and the portion P1 on the inner surface 7c side of the through hole 7 with respect to the surface S and the portion P2 on the side opposite the inner surface 7c of the through hole 7 with respect to the surface S are focused on, the volume of the portion P1 is larger than the volume of the portion P2. In addition, when attention is paid to a region on one side of the center line CL in the plane including the center line CL of the through hole 7, the area of the triangle T1 is larger than the area of the triangle T2. Accordingly, on the surface 10b of the resin insulating layer 10, the first region 11 and the second region 12 are smoothly connected, and it is possible to reliably prevent a disconnection of the second wiring 8 at a boundary between the first region 11 and the second region 12.

In the semiconductor device 1, within the surface 10b of the resin insulating layer 10 provided on the inner surface 7c of the through hole 7, a region on the first opening 7a side relative to the fourth region 14 having the maximum convex curvature toward the side opposite the inner surface 7c of the through hole 7 is the first region 11, and a region on the second opening 7b side relative to the fourth region 14 is the second region 12. Such a shape of the resin insulating layer 10 is particularly effective for forming a reliable electrical connection via the through hole 7 in the semiconductor substrate 2.

Next, a method of manufacturing the semiconductor device 1 described above will be described with reference to FIG. 4 to FIG. 9. First, as shown in (a) of FIG. 4, the P-type region 2c is formed in the semiconductor substrate 2, and the oxide film 4 and the first wiring 3 are provided on the first surface 2a of the semiconductor substrate 2 (first process). Subsequently, as shown in (b) of FIG. 4, the light transmitting substrate (support substrate) 5 is attached to the first surface 2a of the semiconductor substrate 2 with the adhesive layer 6 therebetween (second process).

Subsequently, as shown in (a) of FIG. 5, when the second surface 2b of the semiconductor substrate 2 to which the light transmitting substrate 5 is attached is polished (that is, when a portion on the second surface 2b side of the semiconductor substrate 2 is removed), the semiconductor substrate 2 is thinned so that the thickness of the semiconductor substrate 2 is smaller than the thickness of the light transmitting substrate 5 (third process). In this manner, when the semiconductor substrate 2 is thinned, it is possible to easily form the through hole 7 in a process subsequent thereto. In addition, it is possible to increase a response speed in the completed semiconductor device 1. Subsequently, as shown in (b) of FIG. 5, the through hole 7 is formed in the semiconductor substrate 2 by anisotropic wet etching. Further, as shown in (a) of FIG. 6, a portion corresponding to the pad portion 3a of the first wiring 3 in the oxide film 4 is removed, and the opening 4a is formed in the oxide film 4. Accordingly, the pad portion 3a of the first wiring 3 is exposed to the first opening 7a of the through hole 7 (fourth process). Here, when viewed in a direction parallel to the center line CL of the through hole 7, there is no need to form the opening 4a in the oxide film 4 to match the edge of the first opening 7a of the through hole 7, and, for example, the opening 4a may be formed in the oxide film 4 so that the edge of the opening 4a of the oxide film 4 is positioned further inside than the edge of the first opening 7a of the through hole 7.

Subsequently, when a positive type first resin material having a viscosity of 10 cp or more is prepared and a dip coating method (a method of immersing an object in a resin paint, pulling the object out of the resin paint, and thus forming a resin layer on the object) is performed using the first resin material, as shown in (b) of FIG. 6, the resin insulating layer 10 is provided on the inner surface 7c of the through hole 7 and the second surface 2b of the semiconductor substrate 2 (fifth process). Accordingly, in the resin insulating layer 10, a recess 17 having an inner surface that follows the second region 12, the third region 13, and the fifth region 15 is formed. In addition, the first resin material is also adhered to a surface on the side opposite the semiconductor substrate 2 of the light transmitting substrate 5 and a resin layer 100 is formed. Here, as the first resin material, for example, a phenolic resin, a polyimide resin, or an epoxy resin can be used.

Subsequently, as shown in (a) of FIG. 7, using a mask (not shown), light is emitted to only a portion corresponding to a contact hole 16 and a portion corresponding to the opening 10c in the resin insulating layer 10, and only these portions are exposed. Further, light is also emitted to the resin layer 100 (refer to (b) of FIG. 6), and the resin layer 100 is also exposed. Then, in the resin insulating layer 10, when the portion corresponding to the contact hole 16, the portion corresponding to the opening 10c, and the resin layer 100 are developed, the contact hole 16 and the opening 10c are formed in the resin insulating layer 10, and the resin layer 100 (that is, the first resin material adhered to a surface of the light transmitting substrate 5 on the side opposite the semiconductor substrate 2) is removed. Accordingly, the pad portion 3a of the first wiring 3 is exposed to the opening 10a of the resin insulating layer 10, and a part of the second surface 2b of the semiconductor substrate 2 is exposed to the opening 10c of the resin insulating layer 10 (sixth process). Here, when the contact hole 16 is formed, an ashing treatment may be performed in combination.

During exposure, a gap is formed due to the recess 17 formed in the resin insulating layer 10 between a light transmitting portion of the mask (not shown) and the portion corresponding to the contact hole 16 in the resin insulating layer 10. Accordingly, light is diffracted and emitted to the resin insulating layer 10. Therefore, during development, the tapered first region 11 that enlarges from the first surface 2a to the second surface 2b of the semiconductor substrate 2 and the contact hole 16 having an inner surface that follows the second region 12 are formed.

Subsequently, as shown in (b) of FIG. 7, for example, when a sputtering method using aluminum is performed, the second wiring 8 and the third wiring 22 are provided on the surface 10b of the resin insulating layer 10, the first wiring 3 and the second wiring 8 are electrically connected in the opening 10a of the resin insulating layer 10, and the third wiring 22 and the second surface 2b of the semiconductor substrate 2 are electrically connected in the opening 10c of the resin insulating layer 10 (seventh process). In this case, since the contact hole 16 has an inner surface following the tapered first region 11 that enlarges from the first surface 2a to the second surface 2b of the semiconductor substrate 2, a metal film is also reliably formed on the inner surface, and additionally, the first wiring 3 and the second wiring 8 are reliably connected in the opening 10a of the resin insulating layer 10.

Subsequently, when a positive-type second resin material having a viscosity of 10 cp or more is prepared and a dip coating method is performed using the second resin material, as shown in (a) of FIG. 8, the resin protective layer 21 is provided on the surface 10b of the resin insulating layer 10 to cover the second wiring 8 and the third wiring 22 (eighth process). Accordingly, the recess 21a is formed in the resin protective layer 21. In addition, the second resin material is also adhered to a surface of the light transmitting substrate 5 on the side opposite the semiconductor substrate 2 and a resin layer 210 is formed. Here, as the second resin material, for example, a phenolic resin, a polyimide resin, or an epoxy resin can be used.

Subsequently, as shown in (b) of FIG. 8, using a mask (not shown), light is emitted to only a portion corresponding to the pad portion 8a of the second wiring 8 and a portion corresponding to the pad portion 22a of the third wiring 22 in the resin protective layer 21, and only these portions are exposed. Further, light is also emitted to the resin layer 210 (refer to (a) of FIG. 8), and the resin layer 210 is also exposed. Then, when the portion corresponding to the pad portion 8a of the second wiring 8, the portion corresponding to the pad portion 22a of the third wiring 22, and the resin layer 210 in the resin protective layer 21 are developed, the opening 21b and the opening 21c are formed in the resin protective layer 21 and the resin layer 210 (that is, the second resin material adhered to a surface of the light transmitting substrate 5 on the side opposite the semiconductor substrate 2) is removed. Accordingly, the pad portion 8a of the second wiring 8 is exposed to the opening 21b of the resin protective layer 21, and the pad portion 22a of the third wiring 22 is exposed to the opening 21c of the resin protective layer 21 (ninth process). Finally, the extraction electrode 9 is arranged in the pad portion 8a of the second wiring 8 that is not covered with the resin protective layer 21, the extraction electrode 23 is arranged in the pad portion 22a of the third wiring 22 that is not covered with the resin protective layer 21, and the semiconductor device 1 described above is obtained.

Processes of the above dip coating method will be described in further detail. In the present embodiment, the first resin material for forming the resin insulating layer 10 and the second resin material for forming the resin protective layer 21 are the same. Therefore, the dip coating method for forming the resin insulating layer 10 and the dip coating method for forming the resin protective layer 21 are performed as follows. Here, the processes of the method of manufacturing the semiconductor device 1 described above are performed at a wafer level. Finally, a wafer including a plurality of semiconductor devices 1 is diced and individual semiconductor devices 1 are obtained.

As shown in FIG. 9, a wafer W including portions corresponding to the plurality of semiconductor devices 1 is immersed in a resin material F stored in a container C. When the wafer W is immersed in the resin material F, a state in which a liquid level FL of the resin material F stored in the container C intersects the first surface 2a of the semiconductor substrate 2 (in the present embodiment, an orthogonal state, that is, a state in which the first surface 2a of the semiconductor substrate 2 is parallel with a vertical direction) is maintained.

Subsequently, the wafer W including portions corresponding to the plurality of semiconductor devices 1 is pulled out of the resin material F stored in the container C. When the wafer W is pulled out of the resin material F, a state in which the liquid level FL of the resin material F stored in the container C intersects the first surface 2a of the semiconductor substrate 2 (in the present embodiment, an orthogonal state, that is, a state in which the first surface 2a of the semiconductor substrate 2 is parallel with a vertical direction) is maintained.

Thereafter, the resin material F applied to the wafer W is pre-baked. When the pre-baking is performed, it is preferable to maintain an orientation of the wafer W as the same orientation when the semiconductor substrate 2 is immersed in and pulled out of the resin material F. The reason for this is as follows. That is, when the pre-baking is performed, if an orientation of the wafer is changed to an orientation different from the orientation when the semiconductor substrate 2 is immersed in and pulled out of the resin material, an adhesion state of the resin material F changes, and there is a risk of a formation state of the resin insulating layer 10 and the resin protective layer 21 for each through hole 7 changing.

Here, a detailed example of a process of patterning the resin insulating layer 10 and the resin protective layer 21 is as follows. That is, a resin material is applied by the dip coating method, the above pre-baking of the resin material is performed, the above exposure of the resin material is performed, the resin material is baked, the above development of the resin material is performed, and the resin material is baked. Here, baking after the above exposure of the resin material is performed and baking before the resin material is developed may not be performed.

As described above, in the method of manufacturing the semiconductor device 1, processes after the process of thinning the semiconductor substrate 2 are performed while the light transmitting substrate 5 is attached to the semiconductor substrate 2. Accordingly, it is possible to prevent damage to a peripheral portion of the through hole 7. In addition, when the dip coating method is performed, the resin insulating layer 10 is formed. Accordingly, it is possible to reliably form the resin insulating layer 10 having a sufficient thickness at which electrical insulation can be ensured. Therefore, according to the method of manufacturing the semiconductor device 1, it is possible to prevent damage to a peripheral portion of the through hole 7 while thinning the semiconductor substrate 2, and it is possible to ensure electrical insulation between a wiring in the through hole 7 and the semiconductor substrate 2.

In the method of manufacturing the semiconductor device 1, in the dip coating method for forming the resin insulating layer 10 and the dip coating method for forming the resin protective layer 21, immersion in and pulling out of the resin material F are performed as follows. That is, the semiconductor substrate 2 to which the light transmitting substrate 5 is attached is immersed in the stored resin material F so that the liquid level FL of the stored resin material F intersects the first surface 2a of the semiconductor substrate 2, and the semiconductor substrate 2 to which the light transmitting substrate 5 is attached is pulled out of the stored resin material F so that the liquid level FL of the stored resin material F intersects the first surface 2a of the semiconductor substrate 2. Accordingly, for example, compared to when immersion in and pulling out of the resin material F are performed while the liquid level FL of the stored resin material F and the first surface 2a of the semiconductor substrate 2 are parallel to each other, it is possible to reduce stress generated in the peripheral portion of the through hole 7. In addition, for example, compared to when immersion in and pulling out of the resin material F are performed while the liquid level FL of the stored resin material F and the first surface 2a of the semiconductor substrate 2 are parallel to each other, it is possible to prevent bubbles from remaining on the resin insulating layer 10 formed on the inner surface 7c of the through hole 7.

In the method of manufacturing the semiconductor device 1, in the dip coating method for forming the resin insulating layer 10 and the dip coating method for forming the resin protective layer 21, the same resin material having a viscosity of 10 cp or more is used. When a resin material having a viscosity of 10 cp or more is used, it is possible to reliably form the resin insulating layer 10 having a sufficient thickness at which electrical insulation can be ensured and it is possible to reliably form the resin protective layer 21 having a sufficient thickness at which the second wiring 8 and the third wiring 22 can be protected. In addition, since the same resin material is used, even if the resin insulating layer 10 and the resin protective layer 21 are deformed due to a change in temperature, the degrees of deformation thereof are the same. Therefore, it is possible to prevent damage to the second wiring 8 and the third wiring 222 caused by a large difference between the degrees of deformation thereof.

Here, in the dip coating method, a low viscosity resin material (for example, a resin material used for a water repellent coating, for example, a resin material having a viscosity of 1 cp or less) is generally used. However, even if the dip coating method is performed using such a resin material, the resin insulating layer 10 is formed with substantially a uniform thickness along the inner surface 7c of the through hole 7. Thus, in the method of manufacturing the semiconductor device 1, when the dip coating method is performed using a resin material having a viscosity of 10 cp or more, it is possible to obtain the resin insulating layer 10 having the shape described above easily and reliably.

In the method of manufacturing the semiconductor device 1, when the contact hole 16 and the opening 10c are formed in the resin insulating layer 10, the resin layer 100 (that is, the first resin material adhered to a surface of the light transmitting substrate 5 on the side opposite the semiconductor substrate 2) is removed. In addition, when the opening 21b and the opening 21c are formed in the resin protective layer 21, the resin layer 210 (that is, the second resin material adhered to a surface of the light transmitting substrate 5 on the side opposite the semiconductor substrate 2) is removed. Therefore, even if the light transmitting substrate 5 is used as a support substrate, since the resin layer 100 and the resin layer 210 are removed from the support substrate, the support substrate can effectively function as the light transmitting substrate 5.

Here, it is suitable to remove the resin layer 100 and the resin layer 210 separately during each development rather than removing the resin layer 100 and the resin layer 210 together. When the resin material is additionally baked after development, since the resin material cannot be removed after the baking, for example, even if the resin layer 210 and the resin layer 100 are removed in the last process, when the resin layer 100 is left, the resin layer 100 cannot be removed. Thus, the resin layer 100 and the resin layer 210 are removed during each development. Of course, complete removal of the resin layer 100 and the resin layer 210 is effective when the support substrate is used as the light transmitting substrate 5. In addition, even if the support substrate is not used as the light transmitting substrate 5 (when finally removed), when the resin layer 100 and the resin layer 210 are not completely removed, an unevenness occurs in a fixed surface in a wafer process, the process becomes unstable, and stress is applied to the semiconductor substrate 2. Therefore, complete removal of the resin layer 100 and the resin layer 210 is also effective when the support substrate is not used as the light transmitting substrate 5 (when finally removed).

In the method of manufacturing the semiconductor device 1, when the dip coating method is performed, the resin protective layer 21 is formed on the surface 10b of the resin insulating layer 10 to cover the second wiring 8 and the third wiring 22. Accordingly, the shallow recess 21a having a smooth inner surface is formed in the portion corresponding to the through hole 7 in the resin protective layer 21. Therefore, when the semiconductor device 1 is mounted in the circuit substrate through the extraction electrode 9 and the extraction electrode 23, and an underfill resin is filled between the semiconductor device 1 and the circuit substrate, the underfill resin easily flows inside the recess 21a, and it is difficult for bubbles and the like to remain inside the recess 21a.

In the method of manufacturing the semiconductor device 1, using the positive resin material, the resin insulating layer 10 is provided on the inner surface 7c of the through hole 7 and the second surface 2b of the semiconductor substrate 2. Then, when the portion corresponding to the contact hole 16 in the resin insulating layer 10 is exposed and developed, the contact hole 16 is formed in the resin insulating layer 10. Accordingly, it is possible to obtain the resin insulating layer 10 having the shape described above easily and reliably. Here, during exposure and development, since the thickness of the portion corresponding to the contact hole 16 in the resin insulating layer 10 becomes thinner (that is, since the portion corresponding to the contact hole 16 is a portion having a height H of ½ of a sum D of the thickness of the semiconductor substrate 2 and the average thickness of the resin insulating layer 10 provided on the second surface 2b or less within the resin insulating layer 10) due to the recess 17 formed in the resin insulating layer 10, it is possible to obtain the contact hole 16 having a desired shape easily and reliably.

While one embodiment of the present invention has been described above, the present invention is not limited to the above embodiment. For example, while the first opening 7a of the through hole 7 is covered with the pad portion 3a of the first wiring 3 in the above embodiment, a portion of the first wiring 3 may be located above the first opening 7a, and the first wiring 3 may not cover the entire region of the first opening 7a.

In addition, in the above embodiment, the average inclination angle of the first region 11 is closer to the average inclination angle of the inner surface 7c of the through hole 7 than the average inclination angle of the second region 12. However, the average inclination angle of the second region 12 may be closer to the average inclination angle of the inner surface 7c of the through hole 7 than the average inclination angle of the first region 11.

In addition, in the above embodiment, the light transmitting substrate 5 is used as the support substrate. However, when the semiconductor device 1 does not include the light transmitting substrate 5, another substrate can be used as the support substrate. When another substrate is used as the support substrate, after the extraction electrode 9 and the extraction electrode 23 are provided in a process of manufacturing the semiconductor device 1, the support substrate may be removed from the semiconductor substrate 2. In addition, when another substrate is used as the support substrate, the dip coating method is performed, and thus the resin layer 100 and the resin layer 210 adhered to the support substrate may be removed or left. Further, when another substrate is used as the support substrate, there is no need to use an optical adhesive as the adhesive layer 6.

In addition, in the above embodiment, when viewed in a direction parallel to the center line CL of the through hole 7, the pad portion 8a of the second wiring 8 and the extraction electrode 9 are positioned in the vicinity of the outside of the second opening 7b of the through hole 7. However, the pad portion 8a of the second wiring 8 and the extraction electrode 9 that are sufficiently separated from the second opening 7b of the through hole 7 may be positioned on a surface on the side opposite the second surface 2b of the semiconductor substrate 2 within the surface 10b of the resin insulating layer 10. However, when viewed in a direction parallel to the center line CL of the through hole 7, even if the pad portion 8a of the second wiring 8 and the extraction electrode 9 are positioned in the vicinity of the outside of the second opening 7b of the through hole 7, as shown in FIG. 10, stress generated when the extraction electrode 9 expands due to heat or the like is dispersed in directions of arrows A1, A2, and A3. This is because a sidewall (inner surface) of the opening 21b of the resin protective layer 21 in which the extraction electrode 9 is provided is curved. In addition, this is because the surface 10b of the resin insulating layer 10 provided on the inner surface 7c of the through hole 7 and the surface 10b of the resin insulating layer 10 provided on the second surface 2b of the semiconductor substrate 2 are smoothly connected. Further, stress applied in the direction of the arrow A3 is applied in a direction of an arrow A4 along the second wiring 8. Thus, even if the pad portion 8a of the second wiring 8 and the extraction electrode 9 are positioned in the vicinity of the outside of the second opening 7b of the through hole 7, a disconnection of the second wiring 8 in the vicinity of a portion of the second opening 7b of the through hole 7 is prevented. If stress is applied only in the direction of the arrow A3, there is a risk of the opening 21b of the resin protective layer 21 being pressed and widened and the second wiring 8 being disconnected.

In addition, as shown in FIG. 11, the extraction electrode 9 may be arranged inside the through hole 7 to protrude from the second surface 2b of the semiconductor substrate 2. Even if the extraction electrode 9 is arranged inside the through hole 7, since the inner surface 7c of the through hole 7 is a tapered surface that enlarges from the first surface 2a to the second surface 2b, a metal material such as melted solder (a material for forming the extraction electrode 9) easily flows into the through hole 7 and it is difficult for bubbles and the like to remain inside the through hole 7. In addition, for example, even if some external force is applied to the extraction electrode 9 from the second opening 7b side to the first opening 7a side of the through hole 7, the resin insulating layer 10 (in particular, the third curved portion 103 described above) functions as a buffer region. Therefore, it is possible to reduce stress generated in the extraction electrode 9, and it is possible to reliably maintain an electrical connection between the first wiring 3, and the second wiring 8 and the extraction electrode 9. Here, when the extraction electrode 9 is arranged inside the through hole 7, since there is no need to extract the second wiring 8 to the outside of the second opening 7b of the through hole 7, when viewed in a direction parallel to the center line CL of the through hole 7, the outer edge of the second wiring 8 may be positioned inside the second opening 7b of the through hole 7. That is, the outer edge of the second wiring 8 may be positioned on a surface on the side opposite the inner surface 7c of the through hole 7 within the surface 10b of the resin insulating layer 10.

In addition, as shown in FIG. 12 and FIG. 13, when viewed in a direction parallel to the center line CL of the through hole 7, the outer edge of the second wiring 8 except a portion that extends to the pad portion 8a may be positioned inside the second opening 7b of the through hole 7. That is, the outer edge of the second wiring 8 except a portion that extends to the pad portion 8a may be positioned on a surface on the side opposite the inner surface 7c of the through hole 7 within the surface 10b of the resin insulating layer 10. In this case, since only the portion that extends to the pad portion 8a within the second wiring 8 crosses the second opening 7b of the through hole 7, it is possible to prevent a current from leaking between the second wiring 8 and the semiconductor substrate 2 in a portion of the second opening 7b of the through hole 7 more reliably. In particular, when the shape of the second opening 7b of the through hole 7 is rectangular, the portion that extends to the pad portion 8a within the second wiring 8 is formed to cross a side portion other than the rectangular corner portion so that it is possible to prevent a current from leaking between the second wiring 8 and the semiconductor substrate 2 in a portion of the second opening 7b of the through hole 7 more reliably. Here, in FIG. 13, the resin insulating layer 10 is indicated by a dashed line, and the second wiring 8 is indicated by an alternate long and two short dashes line.

In addition, as shown in FIG. 14, the inner surface 7c of the through hole 7 (when the inner surface 7c of the through hole 7 is a curved surface such as a cylindrical surface, the tangential plane of the curved surface) may be a surface orthogonal to the first surface 2a and the second surface 2b. In this case, a reliable electrical connection via the through hole 7 in the semiconductor substrate 2 can be formed. Here, the aspect ratio of the through hole 7 is 0.2 to 10. As an example, the depth of the through hole 7 is 40 μm, and the width of the second opening 7b is 30 μm. In this case, the aspect ratio is 1.3. Here, the through hole 7 having a shape such as a cylindrical shape or a quadrangular prism shape is formed by, for example, dry etching.

In the through hole 7 shown in FIG. 14, the average inclination angle β of the second region 12 is smaller than the average inclination angle α of the first region 11, and is also smaller than the average inclination angle γ (in this case, 90°) of the inner surface 7c of the through hole 7. That is, the second region 12 is a region that has a gentler inclination than the first region 11 and has a gentler inclination than the inner surface 7c of the through hole 7. In addition, the average inclination angle α of the first region 11 is closer to the average inclination angle γ of the inner surface 7c of the through hole 7 than the average inclination angle β of the second region 12. Here, the relationship of the average inclination angle γ of the inner surface 7c of the through hole 7>the average inclination angle α of the first region 11>the average inclination angle β of the second region 12 is established. Accordingly, it is possible to prevent a disconnection of the second wiring 8 and it is possible to obtain the opening 10a having a sufficient area for exposing the pad portion 3a of the first wiring 3. In addition, the surface 10b of the resin insulating layer 10 is a continuous surface (a surface in which there is no discontinuous portion such as an intersection line (such as a corner or an angulated portion) between a surface and a surface, and the regions 11, 12, 13, 14, and 15 are smoothly connected). In addition, in the resin insulating layer 10, when the surface S passing through the edge of the opening 10a of the resin insulating layer 10 and the edge of the second opening 7b of the through hole 7 is set as a boundary surface, and the portion P1 on the inner surface 7c side of the through hole 7 with respect to the surface S and the portion P2 on the side opposite the inner surface 7c of the through hole 7 with respect to the surface S are focused on, the volume of the portion P1 is larger than the volume of the portion P2. In addition, in the resin insulating layer 10, when attention is paid to a region on one side of the center line CL in the plane including the center line CL of the through hole 7, an area of the triangle T1 is larger than an area of the triangle T2. In addition, in a direction parallel to the first surface 2a and the second surface 2b of the semiconductor substrate 2, an average thickness of the portion corresponding to the first region 11 within the resin insulating layer 10 is greater than an average thickness of the portion corresponding to the second region 12 within the resin insulating layer 10.

In addition, the first region 11 may be the surface 10b of a portion having a height H of ⅔ of a sum D of the thickness of the semiconductor substrate 2 and the average thickness of the resin insulating layer 10 provided on the second surface 2b of the semiconductor substrate 2 or less within the resin insulating layer 10 provided on the inner surface 7c of the through hole 7 (refer to FIG. 14). In this case, on the surface 10b of the resin insulating layer 10, the first region 11 and the second region 12 are smoothly connected, and it is possible to reliably prevent a disconnection of the second wiring 8 at a boundary between the first region 11 and the second region 12. Here, during exposure and development, since the thickness of the portion corresponding to the contact hole 16 in the resin insulating layer 10 becomes thinner (that is, since the portion corresponding to the contact hole 16 is a portion having a height H of ⅔ of a sum D of the thickness of the semiconductor substrate 2 and the average thickness of the resin insulating layer 10 provided on the second surface 2b or less within the resin insulating layer 10) due to the recess 17 formed in the resin insulating layer 10, it is possible to obtain the contact hole 16 having a desired shape easily and reliably.

In addition, in the method of manufacturing the semiconductor device 1, when the resin insulating layer 10 is provided on the inner surface 7c of the through hole 7 and the second surface 2b of the semiconductor substrate 2 using the positive resin material, and the portion corresponding to the contact hole 16 and the portion corresponding to the opening 10c in the resin insulating layer 10 are exposed and developed, the contact hole 16 and the opening 10c are formed in the resin insulating layer 10. However, the present invention is not limited thereto. For example, using a negative-type resin material, the resin insulating layer 10 may be provided on the inner surface 7c of the through hole 7 and the second surface 2b of the semiconductor substrate 2. In this case, when a portion other than the portion corresponding to the contact hole 16 and the portion corresponding to the opening 10c in the resin insulating layer 10 is exposed, and the portion corresponding to the contact hole 16 and the portion corresponding to the opening 10c in the resin insulating layer 10 are developed, the contact hole 16 and the opening 10c may be formed in the resin insulating layer 10. The tapered contact hole 16 that enlarges from the second surface 2b to the first surface 2a of the semiconductor substrate 2 may be formed simply by the development according to light attenuation, light diffraction, and the like. However, when a heat treatment or the like is additionally performed, it is possible to obtain the tapered contact hole 16 that enlarges from the first surface 2a to the second surface 2b of the semiconductor substrate 2.

In addition, in the above embodiment, the P-type region 2c in which P-type impurities are selectively diffused is provided in a predetermined region on the first surface 2a side in the semiconductor substrate 2 including, for example, N-type silicon. However, conductivity-types may be vice versa. In this case, the extraction electrode 9 and the extraction electrode 23 function as a cathode electrode and an anode electrode, respectively. Further, there is no limitation to a structure in which, in a first-conductivity-type (one of the P-type and the N-type) semiconductor substrate 2, a second-conductivity-type (the other of the P-type and the N-type) region is formed, and a structure in which, on a first-conductivity-type (one of the P-type and the N-type) semiconductor substrate 2, a second-conductivity type (the other of the P-type and the N-type) semiconductor layer is formed, or a structure in which a first-conductivity-type (one of the P-type and the N-type) semiconductor layer is formed on a substrate and a second-conductivity-type (the other of the P-type and the N-type) semiconductor layer formed on the first-conductivity-type semiconductor layer may be used. That is, the second-conductivity-type region may be formed on the first-conductivity-type region of the semiconductor substrate 2. In addition, in the above embodiment, the semiconductor device 1 is an optical device, for example, a silicon photodiode. However, the semiconductor device 1 may be another optical device, or may be an electronic device, or the like.

In addition, in the method of manufacturing the semiconductor device 1, the resin insulating layer 10 and the resin protective layer 21 are provided by performing the dip coating method. However, the present invention is not limited thereto. For example, the resin insulating layer 10 and/or the resin protective layer 21 may be provided by performing another method such as a lamination method using a resin sheet and a spin coating method using a resin paint.

INDUSTRIAL APPLICABILITY

According to the present invention, it is possible to provide a method of manufacturing a semiconductor device through which it is possible to prevent damage to a peripheral portion of a through hole while thinning a semiconductor substrate, and it is possible to ensure electrical insulation between a wiring in the through hole and the semiconductor substrate.

REFERENCE SIGNS LIST

1: Semiconductor device, 2: Semiconductor substrate, 2a: First surface, 2b: Second surface, 3: First wiring, 5: Light transmitting substrate (support substrate), 7: Through hole, 7a: First opening, 7b: Second opening, 7c: Inner surface, 8: Second wiring, 10: Resin insulating layer, 10a: Opening, 10b: Surface, 16: Contact hole, 21: Resin protective layer.

The invention claimed is:

1. A method of manufacturing a semiconductor device comprising:
   a first process in which a first wiring is provided on a first surface of a semiconductor substrate including the first surface and a second surface opposite to each other;
   a second process in which a support substrate is attached to the first surface after the first process;
   a third process in which a portion of the semiconductor substrate on the second surface side is removed and thus the semiconductor substrate is thinned so that the thickness of the semiconductor substrate is smaller than the thickness of the support substrate after the second process;
   a fourth process in which a through hole to extend from the first surface to the second surface is formed in the semiconductor substrate, and a part of the first wiring is exposed to a first opening of the through hole on the first surface side after the third process;
   a fifth process in which a dip coating method is performed using a first resin material and thus a resin insulating layer that is continuous through a second opening of the through hole on the second surface side is provided on the part of the first wiring exposed to the first opening, an inner surface of the through hole and the second surface after the fourth process;
   a sixth process in which a contact hole is formed in the resin insulating layer, and the part of the first wiring is exposed to an opening of the contact hole on the first surface side after the fifth process; and
   a seventh process in which a second wiring is provided on a surface of the resin insulating layer, and the first wiring and the second wiring are electrically connected in the opening of the contact hole on the first surface side after the sixth process.

2. The method of manufacturing a semiconductor device according to claim 1,
   wherein, in the fifth process, the semiconductor substrate to which the support substrate is attached is immersed in the stored first resin material so that a liquid level of the stored first resin material intersects the first surface, and the semiconductor substrate to which the support substrate is attached is pulled out of the stored first resin material so that the liquid level of the stored first resin material intersects the first surface.

3. The method of manufacturing a semiconductor device according to claim 1,
   wherein, in the fifth process, the dip coating method is performed using the first resin material having a viscosity of 10 cp or more.

4. The method of manufacturing a semiconductor device according to claim 1,
   wherein, in the sixth process, the first resin material adhered to a surface of the support substrate on the side opposite the semiconductor substrate in the fifth process is removed.

5. The method of manufacturing a semiconductor device according to claim 1, further comprising
   an eighth process in which a dip coating method is performed using a second resin material and thus a resin protective layer is provided on a surface of the resin insulating layer to cover the second wiring after the seventh process, and
   a ninth process in which an opening is formed in the resin protective layer and a part of the second wiring is exposed to the opening after the eighth process.

6. The method of manufacturing a semiconductor device according to claim 5,
   wherein, in the eighth process, the semiconductor substrate to which the support substrate is attached is immersed in the stored second resin material so that a liquid level of the stored second resin material intersects the first surface, and the semiconductor substrate to which the support substrate is attached is pulled out of the stored second resin material so that the liquid level of the stored second resin material intersects the first surface.

7. The method of manufacturing a semiconductor device according to claim 5,
   wherein, in the eighth process, the dip coating method is performed using the second resin material having a viscosity of 10 cp or more.

8. The method of manufacturing a semiconductor device according to claim 5,
   wherein, in the ninth process, the second resin material adhered to a surface of the support substrate on the side opposite the semiconductor substrate in the eighth process is removed.

9. The method of manufacturing a semiconductor device according to claim 5,
   wherein the first resin material and the second resin material are the same.

* * * * *